US012512066B2

(12) United States Patent
Choi

(10) Patent No.: US 12,512,066 B2
(45) Date of Patent: Dec. 30, 2025

(54) DISPLAY DEVICE HAVING A PLURALITY OF AUXILIARY LINES CONNECTED TO GATE LINES AND DATA LINES

(71) Applicant: Samsung Display Co., LTD., Yongin-si (KR)

(72) Inventor: Jun Won Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/733,722

(22) Filed: Jun. 4, 2024

(65) Prior Publication Data
US 2025/0140202 A1 May 1, 2025

(30) Foreign Application Priority Data
Nov. 1, 2023 (KR) .................. 10-2023-0149088

(51) Int. Cl.
G09G 3/3266 (2016.01)
G09G 3/32 (2016.01)
G09G 3/3275 (2016.01)

(52) U.S. Cl.
CPC ............. *G09G 3/3266* (2013.01); *G09G 3/32* (2013.01); *G09G 3/3275* (2013.01); *G09G 2310/0267* (2013.01); *G09G 2310/0275* (2013.01)

(58) Field of Classification Search
CPC .................................................. G09G 3/3266

USPC .......................................................... 345/204
See application file for complete search history.

(56) References Cited

U.S. PATENT DOCUMENTS

| | | | |
|---|---|---|---|
| 11,132,953 B2 | 9/2021 | Yamada et al. | |
| 2017/0018222 A1* | 1/2017 | Park ..................... | G09G 3/3258 |
| 2020/0394967 A1* | 12/2020 | Park ..................... | G06F 1/1626 |
| 2020/0411625 A1* | 12/2020 | Seo ....................... | G02F 1/1345 |
| 2022/0208100 A1* | 6/2022 | Jung ..................... | G09G 3/3233 |
| 2023/0046181 A1 | 2/2023 | Choi et al. | |

FOREIGN PATENT DOCUMENTS

KR 1020220077323 A 6/2022
KR 1020220091081 A 6/2022

* cited by examiner

*Primary Examiner* — Long D Pham
(74) *Attorney, Agent, or Firm* — CANTOR COLBURN LLP

(57) ABSTRACT

A display device includes: a substrate including a display area and a non-display area; a circuit layer disposed on the substrate; and an element layer disposed on the circuit layer. The circuit layer includes light emitting pixel drivers; gate lines extending in a first direction, and arranged in a second direction in the display area; a gate driving circuit including stages disposed in a portion of the non-display area, arranged in the first direction, and electrically connected to the gate lines; data lines extending in the second direction; first auxiliary lines extending in the first direction; and second auxiliary lines extending in the second direction and adjacent to the data lines in the first direction. The second auxiliary lines include gate bypass auxiliary lines electrically connected between the gate lines and the stages.

20 Claims, 21 Drawing Sheets

DISPLAY DEVICE HAVING A PLURALITY OF AUXILIARY LINES CONNECTED TO GATE LINES AND DATA LINES

This application claims priority to Korean Patent Application No. 10-2023-0149088, filed on Nov. 1, 2023, and all the benefits accruing therefrom under 35 U.S.C. § 119, the content of which in its entirety is herein incorporated by reference.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively superior performance in power consumption, response speed, luminous efficiency, luminance, and wide viewing angle compared to other display devices.

One surface of the display device may include a display area in which an image is displayed and a non-display area that is a periphery of the display area. Emission areas emitting light with respective luminances and colors may be arranged in the display area.

SUMMARY

The display device may include gate lines extending in a first direction, data lines extending in a second direction, a gate driving circuit electrically connected to the gate lines, and a display driving circuit electrically connected to the data lines.

The gate driving circuit is a circuit that sequentially outputs signals to the gate lines arranged in the second direction, and may have a simpler structure than the display driving circuit. Accordingly, the gate driving circuit may be provided as a part of the circuit layer together with the gate lines and the data lines.

In one example, the gate driving circuit may be disposed in the non-display area of a substrate and may include stages electrically connected to the gate lines.

In this case, since the gate driving circuit includes stages arranged in the same direction as the arrangement direction of the gate lines, a portion of the non-display area where the gate driving circuit is disposed may be limited to a portion of the non-display area facing at least one side of the display area in the first direction.

As a result, there is a problem that there is a limit to reducing the width of the non-display area.

In addition, as the width of the display area in the first direction increases, the central portion of the display area in the first direction moves further away from the gate driving circuit, thereby making it difficult to stably supply the signals of the gate lines.

In view of the above, aspects of the present disclosure provide a display device in which a portion of a non-display area of a substrate where a gate driving circuit is disposed may not be limited to a portion of the non-display area facing at least one side of a display area in the first direction.

According to an aspect of the present disclosure, there is provided a display device including a substrate including a display area in which emission areas are arranged, and a non-display area disposed around the display area; a circuit layer disposed on the substrate; and an element layer disposed on the circuit layer, and including light emitting elements disposed in the emission areas, respectively. The circuit layer includes light emitting pixel drivers electrically connected to the light emitting elements, respectively, and arranged in parallel with each other in a first direction and a second direction crossing the first direction; gate lines arranged in the second direction in the display area, extending in the first direction, and for transmitting gate signals to the light emitting pixel drivers; a gate driving circuit including a plurality of stages disposed in a portion of the non-display area, arranged in the first direction, and electrically connected to the gate lines; data lines extending in the second direction, and for transmitting data signals to the light emitting pixel drivers; first auxiliary lines extending in the first direction; and second auxiliary lines extending in the second direction and adjacent to the data lines in the first direction. The second auxiliary lines include gate bypass auxiliary lines electrically connected between the gate lines and the plurality of stages.

An edge of the display area may include a first side and a second side extending in the first direction and opposing each other in the second direction; and a third side and a fourth side connecting the first side to the second side, opposing each other in the first direction, and having a shorter length than the first side and the second side. The gate driving circuit may include a first center circuit portion facing a central portion of the first side in the second direction and including first stages of the plurality of stages arranged in the first direction. The display area may further include a display middle region facing the first center circuit portion in the second direction, and a bypass region in contact with the display middle region in the first direction. The first auxiliary lines may include a first bypass auxiliary line electrically connected to a first data line disposed in the display middle region among the data lines. The second auxiliary lines may further include a second bypass auxiliary line adjacent to a second data line disposed in the bypass region among the data lines and electrically connected to the first bypass auxiliary line, and the gate bypass auxiliary lines may be disposed in the display middle region.

The display device further may include a display driving circuit configured to supply data signals of the data lines. The circuit layer may further include data supply lines disposed in a portion of the non-display area facing the first side, spaced apart from the first center circuit portion in the first direction, and electrically connected between the data lines and the display driving circuit. Among the data supply lines, a first data supply line, which transmits the data signal of the first data line, may be electrically connected to the first data line through the first bypass auxiliary line and the second bypass auxiliary line. Among the data supply lines, a second data supply line, which transmits the data signal of the second data line, may be directly electrically connected to the second data line. The first data line may be adjacent to one of the gate bypass auxiliary lines in the first direction.

The display driving circuit may be mounted on a portion of the non-display area of the substrate facing the first side, and be spaced apart from the first center circuit portion in the first direction.

The display device may further include a circuit board on which the display driving circuit is mounted; and signal pads to which the circuit board is connected. The signal pads may be disposed in the non-display area of the substrate, face the first side, and be spaced apart from the first center circuit portion in the first direction.

The display area may further include a side region disposed between the bypass region and the non-display area in the first direction. The data supply lines may extend to the bypass region and the side region. The data lines may further include a third data line disposed in the side region. Among the data supply lines, a third data supply line, which transmits the data signal of the third data line, may be directly electrically connected to the third data line.

Each of the light emitting pixel drivers of the circuit layer may further include a first transistor electrically connected between a first node and a second node; a pixel capacitor electrically connected between a third node and a first power line for transmitting a first power; a second transistor electrically connected between the data line and the first node; a third transistor electrically connected between the second node and the third node; a fourth transistor electrically connected between the third node and a gate initialization voltage line for transmitting a gate initialization voltage; a fifth transistor electrically connected between the first power line and the first node; a sixth transistor electrically connected between the second node and the fourth node; and a seventh transistor electrically connected between the fourth node and an anode initialization voltage line for transmitting an anode initialization voltage. The first node may be electrically connected to a first electrode of the first transistor. The second node may be electrically connected to a second electrode of the first transistor. The third node may be electrically connected to a gate electrode of the first transistor. The fourth node may be electrically connected to one of the light emitting elements. The gate lines may include a scan write line for transmitting a scan write signal to the light emitting pixel drivers; a scan initialization line for transmitting a scan initialization signal to the light emitting pixel drivers; an emission control line for transmitting an emission control signal to the light emitting pixel drivers; and a gate control line for transmitting a gate control signal to the light emitting pixel drivers. The second transistor and the third transistor may be turned on by the scan write signal. The fourth transistor may be turned on by the scan initialization signal. The fifth transistor and the sixth transistor may be turned on by the emission control signal. The seventh transistor may be turned on by the gate control signal.

The first center circuit portion may include a scan write stage electrically connected to the scan write line; a scan initialization stage electrically connected to the scan initialization line; an emission control stage electrically connected to the emission control line; and a gate control stage electrically connected to the gate control line.

The gate driving circuit further may include a second center circuit portion facing a central portion of the second side of the display area. The display middle region of the display area may be disposed between the first center circuit portion and the second center circuit portion in the second direction. Second stages of the second center circuit portion among the plurality of stages may be arranged in the first direction, and be electrically connected to the gate lines through the gate bypass auxiliary lines. Each of the first center circuit portion and the second center circuit portion may include a scan write stage electrically connected to the scan write line; a scan initialization stage electrically connected to the scan initialization line; an emission control stage electrically connected to the emission control line; and a gate control stage electrically connected to the gate control line.

The gate driving circuit may further include a side circuit portion facing at least one of the third side or the fourth side of the display area.

Each of the first center circuit portion and the side circuit portion may include a scan write stage electrically connected to the scan write line; a scan initialization stage electrically connected to the scan initialization line; an emission control stage electrically connected to the emission control line; and a gate control stage electrically connected to the gate control line.

Some of the scan write line, the scan initialization line, the emission control line, and the gate control line may be electrically connected to the first center circuit portion. The others of the scan write line, the scan initialization line, the emission control line, and the gate control line may be electrically connected to the side circuit portion.

The gate lines may further include a bias control line for transmitting a bias control signal to the light emitting pixel drivers. Each of the light emitting pixel drivers of the circuit layer may further include an eighth transistor electrically connected between a bias power line and the first node. The eighth transistor may be turned on by the bias control signal.

The first auxiliary lines may further include power auxiliary horizontal lines. The second auxiliary lines may further include power auxiliary vertical lines.

According to an aspect of the present disclosure, there is provided a display device including a substrate including a display area in which emission areas are arranged and a non-display area disposed around the display area; a circuit layer disposed on the substrate; and an element layer disposed on the circuit layer, and including light emitting elements disposed in the emission areas, respectively. The circuit layer includes light emitting pixel drivers electrically connected to the light emitting elements, respectively, and arranged in parallel with each other in a first direction and a second direction crossing the first direction; gate lines arranged in the second direction in the display area, extending in the first direction, and for transmitting gate signals to the light emitting pixel drivers; a gate driving circuit including a plurality of stages disposed in a portion of the non-display area, arranged in the first direction, and electrically connected to the gate lines; data lines extending in the second direction, and for transmitting data signals to the light emitting pixel drivers; first auxiliary lines extending in the first direction; and second auxiliary lines extending in the second direction and adjacent to the data lines in the first direction. The display area further includes a display middle region facing a first center circuit portion in the second direction, and a bypass region in contact with the display middle region in the first direction. The first auxiliary lines include a first bypass auxiliary line electrically connected to a first data line disposed in the display middle region among the data lines. The second auxiliary lines include a second bypass auxiliary line adjacent to a second data line disposed in the bypass region among the data lines and electrically connected to the first bypass auxiliary line, and gate bypass auxiliary lines electrically connected between the gate lines and the plurality of stages.

The display device may further include a display driving circuit configured to supply data signals of the data lines. The circuit layer further includes data supply lines disposed in a portion of the non-display area facing a first side of the display area, spaced apart from the first center circuit portion in the first direction, and electrically connected between the data lines and the display driving circuit. Among the data supply lines, a first data supply line, which transmits the data signal of the first data line, may be electrically connected to the first data line through the first bypass auxiliary line and the second bypass auxiliary line. Among the data supply lines, a second data supply line, which transmits the data signal of the second data line, may be directly electrically connected to the second data line. The first data line may be adjacent to one of the gate bypass auxiliary lines in the first direction.

An edge of the display area may include the first side and a second side extending in the first direction and opposing each other in the second direction, and a third side and a fourth side connecting the first side to the second side, opposing each other in the first direction, and each having a shorter length than each of the first side and the second side. The gate driving circuit may include a first center circuit portion facing a central portion of the first side in the second direction, and a second center circuit portion facing a central portion of the second side of the display area in the second direction. The display middle region of the display area may be disposed between the first center circuit portion and the second center circuit portion in the second direction. The plurality of stages of each of the first center circuit portion and the second center circuit portion may be arranged in the first direction, and be electrically connected to the gate lines through the gate bypass auxiliary lines.

Each of the light emitting pixel drivers of the circuit layer may further include a first transistor electrically connected between a first node and a second node; a pixel capacitor electrically connected between a third node and a first power line for transmitting a first power; a second transistor electrically connected between the data line and the first node; a third transistor electrically connected between the second node and the third node; a fourth transistor electrically connected between the third node and a gate initialization voltage line for transmitting a gate initialization voltage; a fifth transistor electrically connected between the first power line and the first node; a sixth transistor electrically connected between the second node and a fourth node; and a seventh transistor electrically connected between the fourth node and an anode initialization voltage line for transmitting an anode initialization voltage. The first node may be electrically connected to a first electrode of the first transistor. The second node may be electrically connected to a second electrode of the first transistor. The third node may be electrically connected to a gate electrode of the first transistor. The fourth node may be electrically connected to one of the light emitting elements. The gate lines may include a scan write line for transmitting a scan write signal to the light emitting pixel drivers; a scan initialization line for transmitting a scan initialization signal to the light emitting pixel drivers; an emission control line for transmitting an emission control signal to the light emitting pixel drivers; and a gate control line for transmitting a gate control signal to the light emitting pixel drivers. The second transistor and the third transistor may be turned on by the scan write signal. The fourth transistor may be turned on by the scan initialization signal. The fifth transistor and the sixth transistor may be turned on by the emission control signal. The seventh transistor may be turned on by the gate control signal.

An edge of the display area may include the first side and a second side extending in the first direction and opposing each other in the second direction, and a third side and a fourth side connecting the first side to the second side, opposing each other in the first direction, and each having a shorter length than each of the first side and the second side. The gate driving circuit may include a first center circuit portion facing a central portion of the first side in the second direction and including first stages of the plurality of stages arranged in the first direction, and a side circuit portion facing at least one of the third side or the fourth side of the display area in the first direction. The first stages of the first center circuit portion may be arranged in the first direction, and are electrically connected to the gate lines through the gate bypass auxiliary lines. Each of the first center circuit portion and the second center circuit portion may be electrically connected to the scan write line, the scan initialization line, the emission control line, and the gate control line.

An edge of the display area may include a first side and a second side extending in the first direction and opposing each other in the second direction, and a third side and a fourth side connecting the first side to the second side, opposing each other in the first direction, and each having a shorter length than each of the first side and the second side. The gate driving circuit may include a first center circuit portion facing a central portion of the first side in the second direction and including first stages of the plurality of stages arranged in the first direction, and a side circuit portion facing at least one of the third side or the fourth side of the display area in the first direction. The first stages of the first center circuit portion may be arranged in the first direction, and be electrically connected to the gate lines through the gate bypass auxiliary lines. Second stages of the side circuit portion among the plurality of stages may be arranged in the second direction. Some of the scan write line, the scan initialization line, the emission control line, and the gate control line may be electrically connected to the first center circuit portion. The others of the scan write line, the scan initialization line, the emission control line, and the gate control line may be electrically connected to the side circuit portion.

A display device according to embodiments includes a substrate, a circuit layer disposed on the substrate, and an element layer disposed on the circuit layer. The substrate includes a display area in which emission areas are arranged, and a non-display area disposed around the display area. The element layer includes light emitting elements respectively disposed in to the emission areas. The circuit layer may include light emitting pixel drivers respectively electrically connected to the light emitting elements, and arranged in parallel with each other in a first direction and a second direction, gate lines arranged in the display area in the second direction, extending in the first direction, and for transmitting gate signals to the light emitting pixel drivers, a gate driving circuit including stages disposed in a portion of the non-display area and respectively electrically connected to the gate lines, data lines extending in the second direction, and for transmitting data signals to the light emitting pixel drivers, first auxiliary lines extending in the first direction, and second auxiliary lines extending in the second direction and adjacent to the data lines. The second auxiliary lines may include gate bypass auxiliary lines electrically connected between the gate lines and stages of the gate driving circuit arranged in the first direction.

As such, according to embodiments, the circuit layer may include second auxiliary lines adjacent to data lines and extending in the second direction. In addition, gate bypass auxiliary lines of the second auxiliary lines are electrically connected between stages of a gate driving circuit arranged in the first direction and gate lines.

That is, the stages of the gate driving circuit arranged differently from the arrangement direction of the gate lines may be electrically connected to the gate lines through the gate bypass auxiliary lines.

Accordingly, the gate driving circuit may include the stages arranged in the first direction which is different from the arrangement direction of the gate lines. As a result, at least a part of the gate driving circuit may be disposed in a portion of the non-display area facing at least one side of the display area in the second direction.

That is, a portion of the non-display area of the substrate where the gate driving circuit is disposed may not be limited to a portion of the non-display area facing at least one side of the display area in the first direction.

Accordingly, in the display device according to embodiments, the gate driving circuit may be disposed anywhere in the non-display area, which may be advantageous in reducing the width of the non-display area.

In addition, according to embodiments, even if the width of the display area in the first direction increases, the signals of the gate lines may be stably supplied.

According to embodiments, the circuit layer may further include data supply lines electrically connected between the data lines and a display driving circuit that supplies data signals. The data lines may include a first data line disposed in a display middle region facing in the second direction the stages of the gate driving circuit arranged in the first direction, and a second data line disposed in a bypass region in contact with the display middle region in the first direction. The first auxiliary lines may include a first bypass auxiliary line electrically connected to a first data line, and the second auxiliary lines may further include a second bypass auxiliary line adjacent to a second data line and electrically connected to the first bypass auxiliary line.

That is, among the data supply lines, a first data supply line for transmitting the data signal of the first data line may extend to the bypass region rather than the display middle region where the first data line is disposed, and may be electrically connected to the first data line through a second bypass auxiliary line and a first bypass auxiliary line.

Accordingly, by disposing at least a part of the gate driving circuit in a portion of the non-display area facing at least one side of the display area in the second direction, an electrical connection between the data lines and the data supply lines may be implemented, even if a portion of the non-display area where the data supply lines are disposed is limited to a portion where the gate driving circuit is not disposed.

In addition, the gate bypass auxiliary lines and the second bypass auxiliary line are provided as a part of the second auxiliary lines adjacent to the data lines, which may be advantageous for slimming down or enhancing the resolution of the display device.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
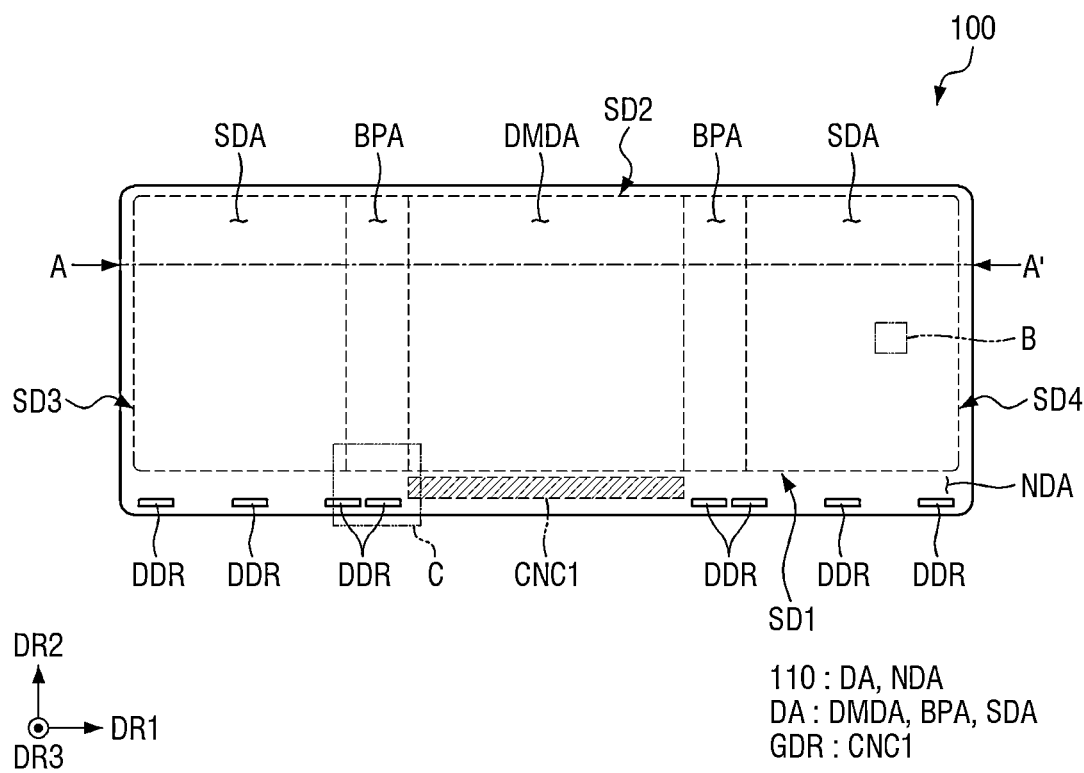
FIG. 1 is a plan view illustrating a display device according to one embodiment.

Embodiments of the present disclosure will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above (i.e., view in a third direction DR3), and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a plan view illustrating a display device according to one embodiment.

As a device for displaying a moving image or a still image, it may be used as a display screen of various products such as televisions, laptop computers, monitors, billboards and the Internet of Things ("IOT") as well as portable electronic devices such as mobile phones, smart phones, tablet personal computers (tablet "PCs"), smart watches, watch phones, mobile communication terminals, electronic notebooks, electronic books, portable multimedia players ("PMPs"), navigation systems and ultra mobile PCs ("UMPCs").

A display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode ("LED"). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but is not limited thereto. For example, the display device 100 may include a curved portion formed at left and right ends and having a constant curvature or a varying curvature. In addition, the display device 100 may be formed to be flexible so that it can be curved, bent, folded, or rolled.

Referring to FIG. 1, the display device 100 according to one embodiment may include a substrate 110.

The substrate 110 may include a display area DA disposed in the center and a non-display area NDA disposed around the display area DA.

The substrate 110 may be prepared as a rectangular plane.

One surface of the substrate 110 may correspond to a display surface through which light for image display is emitted. Most of the area located in the center of the display surface may be the display area DA.

The display area DA may have a shape similar to that of the substrate 110.

That is, the edge of the display area DA may include a first side SD1 and a second side SD2 extending in a first direction DR1 and opposing each other in a second direction DR2, and a third side SD3 and a fourth side SD4 connecting the first side SD1 to the second side SD2, opposing each other in the first direction DR1, and each having a shorter length than each of the first and second sides SD1 and SD2.

The corners where the first side SD1 and the second side SD2, and the third side SD3 and the fourth side SD4 meet each other may be right-angled or may be rounded to have a predetermined curvature. The shape of the display area DA is not limited to a quadrangle with four sides, and may be a circle, an ellipse, or a polygon other than a quadrangle.

The non-display area NDA may be disposed at the edge of the substrate 110 to surround the display area DA.

A part of the non-display area NDA may be transformed into a bent shape, so that another part of the non-display area NDA between the bent portion and the edge of the substrate 110 may be disposed on the rear surface of the substrate 110.

The display device 100 according to one embodiment may further include a gate driving circuit GDR and a display driving circuit DDR disposed in a portion of the non-display area NDA of the substrate 110.

According to one embodiment, the gate driving circuit GDR may include a first center circuit portion CNC1 facing the central portion of the first side SD1 of the display area DA.

According to one embodiment, the display driving circuit DDR may be provided as an integrated circuit ("IC") and may be mounted in a portion of the non-display area NDA of the substrate 110 by a chip on glass ("COG") method, a chip on plastic ("COP") method, or an ultrasonic bonding method.

The display driving circuit DDR may face the first side SD1 of the display area DA and be spaced apart from the first center circuit portion CNC1 in the first direction DR1.

That is, the display driving circuit DDR and the first center circuit portion CNC1 may be arranged in the first direction DR1 in a portion of the non-display area NDA facing the first side SD1 of the display area DA.

The display area DA may include a display middle region DMDA facing the first center circuit portion CNC1 in the second direction DR2, and a bypass region BPA in contact with the display middle region DMDA in the first direction DR1.

In addition, the display area DA may further include a side region SDA disposed between the bypass region BPA and the non-display area NDA in the first direction DR1. In an embodiment, the first center circuit portion CNC1 may face only the display middle region DMDA among the display middle region DMDA, the bypass region BPA, and the side region SDA in the second direction DR2. In an embodiment, the display driving circuit DDR may face only the bypass region BPA and/or the side region SDA among the display middle region DMDA, the bypass region BPA, and the side region SDA in the second direction DR2.

Figure 2:
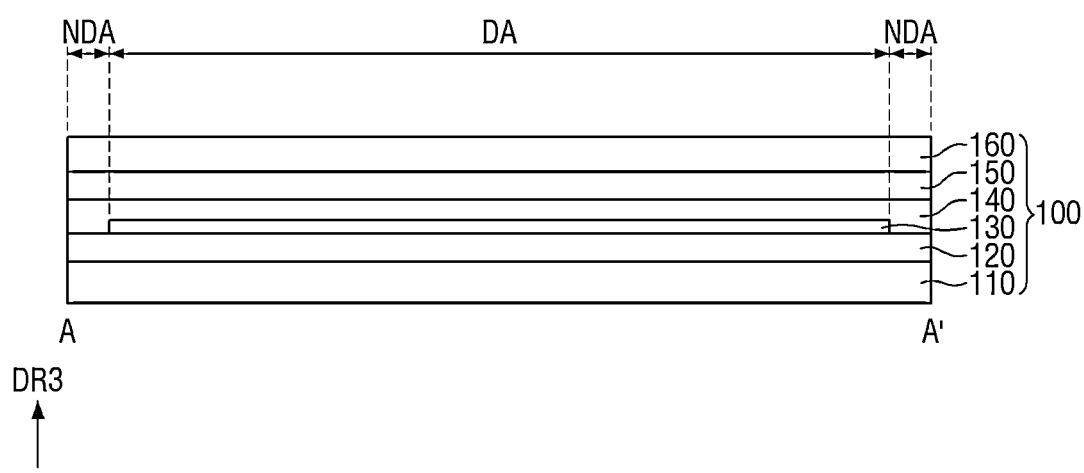
FIG. 2 is a cross-sectional view taken along line A-A' of FIG. 1.

FIG. 2 is a cross-sectional view taken along line A-A' of FIG. 1.

Referring to FIG. 2, the display device 100 according to one embodiment includes the substrate 110, a circuit layer 120 disposed on the substrate 110, and an element layer 130 disposed on the circuit layer 120.

The display device 100 may further include an encapsulation layer 140 covering the element layer 130, and a touch sensor layer 150 disposed on the encapsulation layer 140.

The display device 100 may further include a polarization layer 160 disposed on the touch sensor layer 150, in order to reduce reflection of external light.

The substrate 110 may be formed of an insulating material such as polymer resin. For example, the substrate 110 may be formed of polyimide. The substrate 110 may be a flexible substrate which can be bent, folded or rolled.

Alternatively, the substrate 110 may be formed of an insulating material such as glass or the like.

The substrate 110 may include the display area DA and the non-display area NDA.

Figure 3:
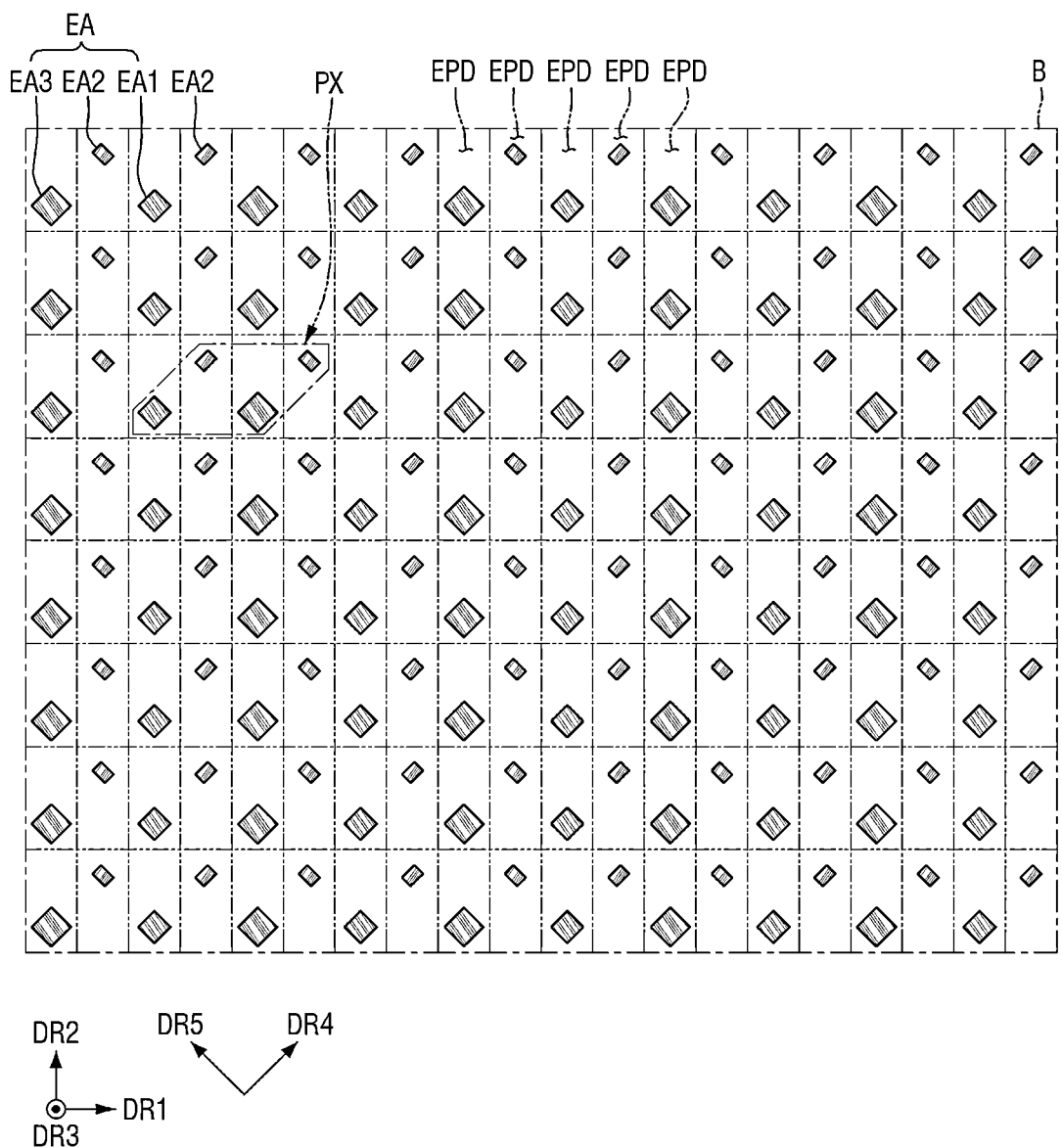
FIG. 3 is a layout diagram illustrating part B of FIG. 1.

FIG. 3 is a layout diagram illustrating part B of FIG. 1.

Referring to FIG. 3, the display area DA of the substrate 110 according to one embodiment may include emission areas EA.

The display area DA may further include a non-emission area disposed in a gap between the emission areas EA.

The emission areas EA may have a rhombus shape or a rectangular shape in a plan view. However, this is only an example, and the planar shape of the emission areas EA according to one embodiment is not limited to that illustrated in FIG. 3. That is, in a plan view, the emission areas EA may have a polygonal shape such as a square, a pentagon, a hexagon, etc., or may have a circular or elliptical shape including the edge of a curve.

The emission areas EA may include first emission areas EA1 emitting light of a first color in a predetermined wavelength band, second emission areas EA2 emitting light of a second color in a wavelength band lower than that of the first color, and third emission areas EA3 emitting light of a third color in a wavelength band lower than that of the second color.

For example, the first color may be red having a wavelength band of approximately 600 nanometers (nm) to 750 nm. The second color may be green having a wavelength band of approximately 480 nm to 560 nm. The third color may be blue having a wavelength band of approximately 370 nm to 460 nm.

The first emission areas EA1 and the third emission areas EA3 may be alternately arranged in at least one of the first direction DR1 or the second direction DR2.

The second emission areas EA2 may be arranged side by side in at least one of the first direction DR1 or the second direction DR2.

In addition, the second emission areas EA2 may be adjacent to the first emission areas EA1 and the third emission areas EA3 in diagonal directions DR4 and DR5 intersecting the first direction DR1 and the second direction DR2.

Pixels PX displaying their own luminances and colors may be provided by the first emission area EA1, the second emission area EA2, and the third emission area EA3 adjacent to each other among these emission areas EA.

In other words, the pixels PX may be a basic unit for displaying various colors including white with a predetermined luminance.

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

According to one embodiment, the element layer 130 may include light emitting elements LE (see FIG. 5) respectively disposed in the emission areas EA.

According to one embodiment, the circuit layer 120 may include light emitting pixel drivers EPD that are respectively electrically connected to the light emitting elements LE of the element layer 130.

The light emitting pixel drivers EPD may be arranged side by side in the first direction DR1 and the second direction DR2.

Figure 4:
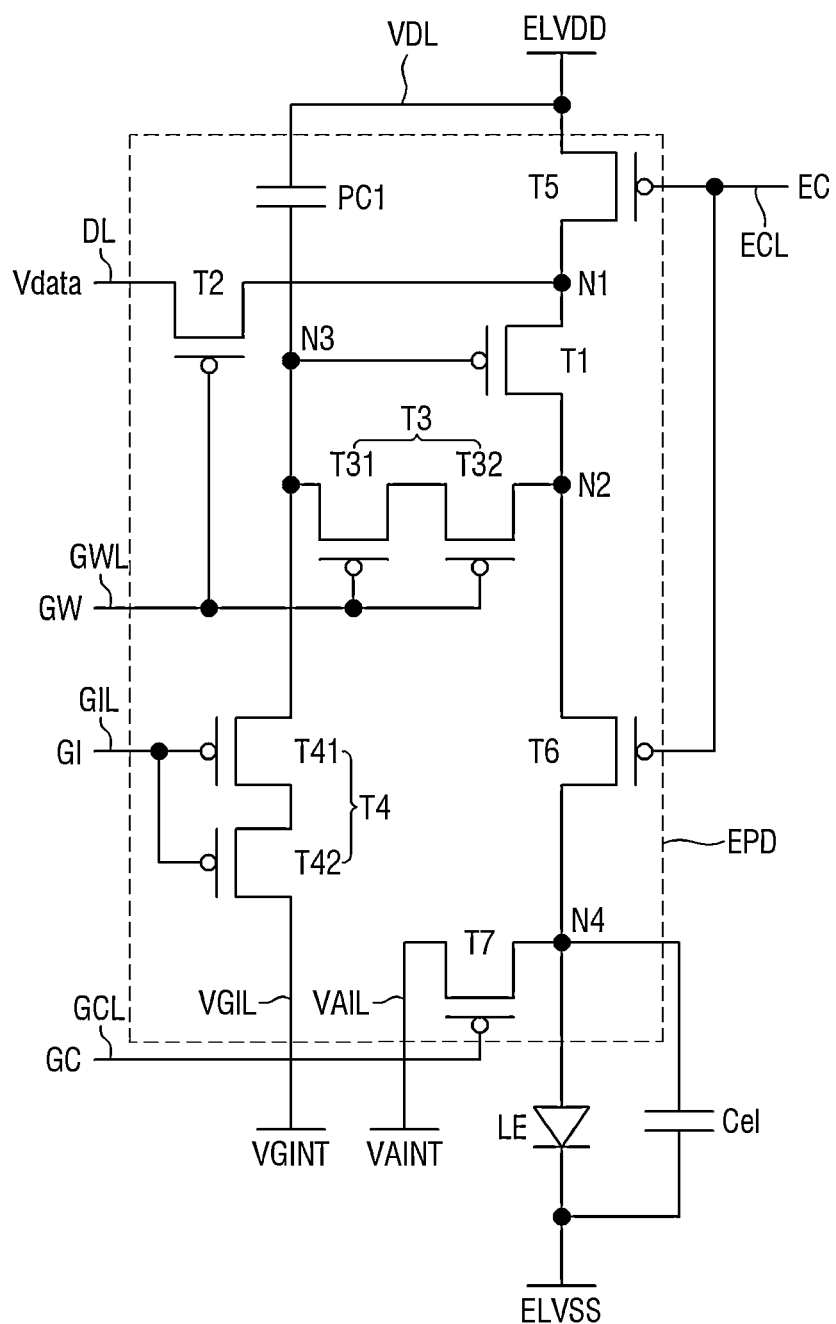
FIG. 4 is an equivalent circuit diagram showing the light emitting pixel driver of FIG. 3.

FIG. 4 is an equivalent circuit diagram showing the light emitting pixel driver of FIG. 3.

Referring to FIG. 4, one of the light emitting elements LE of the element layer 130 may be electrically connected between one of the light emitting pixel drivers EPD of the circuit layer 120 and a second power ELVSS.

That is, an anode electrode 131 (see FIG. 5) of the light emitting element LE may be electrically connected to the light emitting pixel driver EPD, and a cathode electrode 134 (see FIG. 5) of the light emitting element LE may be applied with the second power ELVSS lower than a first power ELVDD.

A capacitor Cel connected in parallel with the light emitting element LE refers to a parasitic capacitance between the anode electrode 131 and the cathode electrode 134.

The circuit layer 120 may include a scan write line GWL for transmitting a scan write signal GW, a scan initialization line GIL for transmitting a scan initialization signal GI, an emission control line ECL for transmitting an emission control signal EC, and a gate control line GCL for transmitting a gate control signal GC.

The circuit layer 120 may further include a first power line VDL for transmitting the first power ELVDD, a gate initialization voltage line VGIL for transmitting a gate initialization voltage VGINT, and an anode initialization voltage line VAIL for transmitting an anode initialization voltage VAINT.

One light emitting pixel driver EPD of the circuit layer 120 may include a first transistor T1 configured to generate a driving current for driving the light emitting element LE, two or more transistors T2 to T7 electrically connected to the first transistor T1, and at least one pixel capacitor PC1.

The first transistor T1 is connected in series with the light emitting element LE between the first power ELVDD and the second power ELVSS.

That is, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode 131 of the light emitting element LE through the sixth transistor T6.

The first electrode of the first transistor T1 may be electrically connected to the data line DL through a second transistor T2.

The gate electrode of the first transistor T1 may be electrically connected to the first power line VDL through the pixel capacitor PC1. That is, the pixel capacitor PC1 may be electrically connected between the gate electrode of the first transistor T1 and the first power line VDL.

Accordingly, the potential of the gate electrode of the first transistor T1 may be maintained by the first power ELVDD of the first power line VDL.

When a data signal Vdata of the data line DL is transmitted to the first electrode of the first transistor T1 through the turned-on second transistor T2, a voltage difference between the gate electrode of the first transistor T1 and the first electrode of the first transistor T1 may correspond to the first power ELVDD and the data signal Vdata.

In this case, when the voltage difference between the gate electrode of the first transistor T1 and the first electrode of the first transistor T1, i.e., the gate-to-source voltage difference becomes equal to or greater than a threshold voltage, the first transistor T1 may be turned on, thereby generating a drain-source current of the first transistor T1 corresponding to the data signal Vdata.

Then, when the fifth transistor T5 and the sixth transistor T6 are turned on, the first transistor T1 may be connected in series with the light emitting element LE between the first power line VDL and the second power line VSL. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The second transistor T2 may be electrically connected between the first electrode of the first transistor T1 and the data line DL. The second transistor T2 may be turned on by the scan write signal GW of the scan write line GWL.

The third transistor T3 may be electrically connected between the gate electrode of the first transistor T1 and the second electrode of the first transistor T1. The third transistor T3 may be turned on by the scan write signal GW of the scan write line GWL.

The third transistor T3 may include a plurality of sub-transistors connected in series. For example, the third transistor T3 may include a first sub-transistor T31 and a second sub-transistor T32. In this way, it is possible to prevent the potential of the gate electrode of the first transistor T1 from changing due to the leakage current through the third transistor T3 that is turned off.

The fourth transistor T4 may be connected between the gate electrode of the first transistor T1 and the gate initialization voltage line VGIL. The fourth transistor T4 may be turned on by the scan initialization signal GI of the scan initialization line GIL.

The fourth transistor T4 may include a plurality of sub-transistors connected in series. For example, the fourth transistor T4 may include a third sub-transistor T41 and a fourth sub-transistor T42. In this way, it is possible to prevent the potential of the gate electrode of the first transistor T1 from changing due to the leakage current through the fourth transistor T4 that is turned off.

The fifth transistor T5 may be electrically connected between the first electrode of the first transistor T1 and the first power line VDL.

The sixth transistor T6 may be electrically connected between the second electrode of the first transistor T1 and the anode electrode 131 of the light emitting element LE.

The fifth transistor T5 and the sixth transistor T6 may be turned on by the emission control signal EC of the emission control line ECL.

The seventh transistor T7 may be electrically connected between the anode electrode 131 of the light emitting element LE and the anode initialization voltage line VAIL.

The seventh transistor T7 may be turned on by the gate control signal GC of the gate control line GCL.

As shown in FIG. 4, the first to seventh transistors T1 to T7 may be provided as P-type MOSFETs. However, this is merely an example, and some of the first to seventh transistors T1 to T7 may be provided as N-type MOSFETs. That is, among the first to seventh transistors T1 to T7, the third transistor T3 and the fourth transistor T4 may be provided as N-type MOSFETs.

Figure 5:
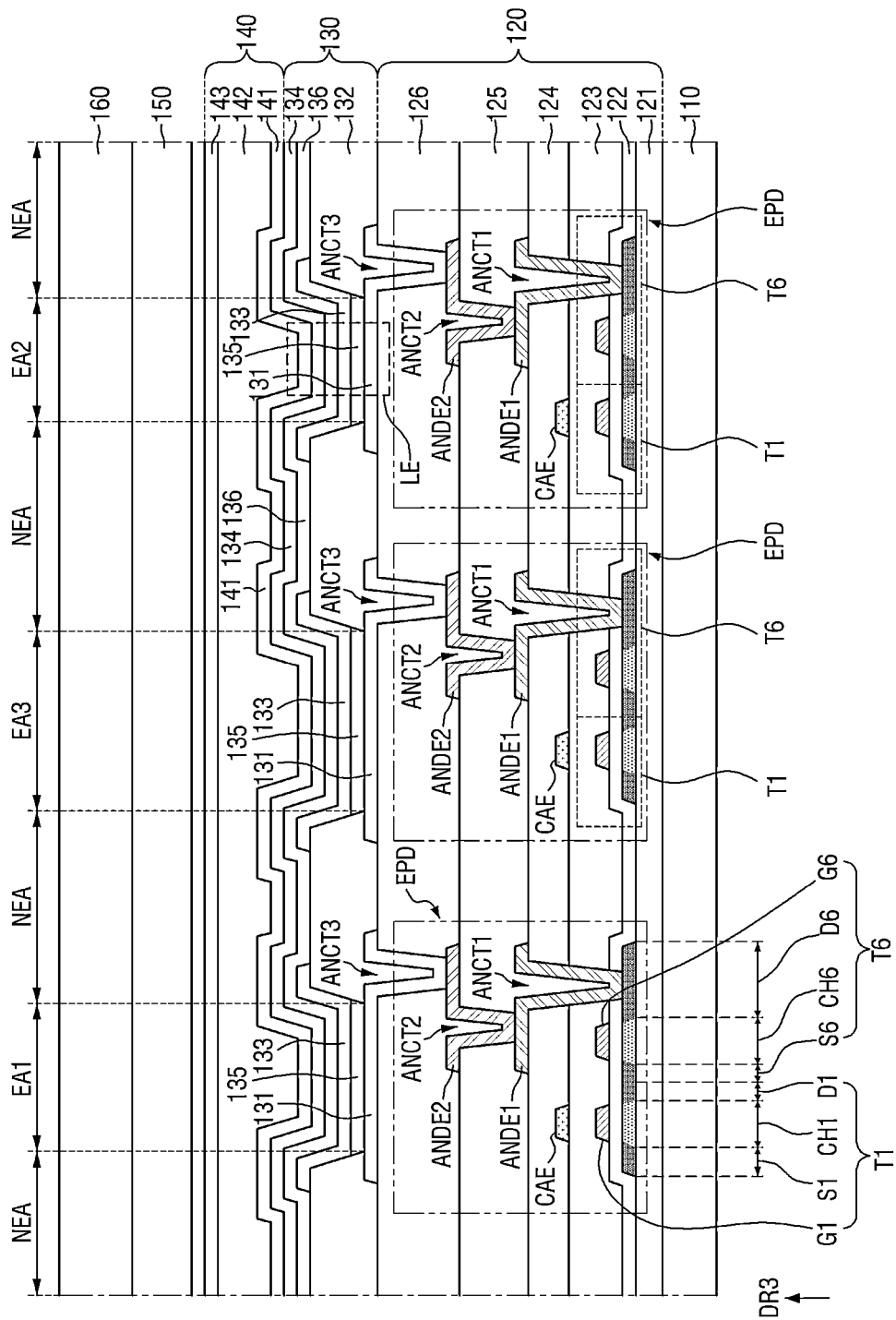
FIG. 5 is a cross-sectional view showing the light emitting element and the first and sixth transistors of FIG. 4.

FIG. 5 is a cross-sectional view showing the light emitting element and the first and sixth transistors of FIG. 4.

Referring to FIG. 5, the display device 100 according to one embodiment may include the substrate 110, the circuit layer 120 on the substrate 110, and the element layer 130 on the circuit layer 120.

In addition, the display device 100 may further include the encapsulation layer 140 disposed on the element layer 130, the touch sensor layer 150 disposed on the encapsulation layer 140, and the polarization layer 160 disposed on the touch sensor layer 150.

The touch sensor layer 150 may be disposed on a touch buffer layer covering the encapsulation layer 140.

The substrate 110 may be formed of an insulating material such as polymer resin. For example, the substrate 110 may contain polyimide.

As shown in FIG. 5, according to embodiments, the circuit layer 120 may include a first semiconductor layer CH1, S1, D1, CH6, S6, and D6 disposed on the substrate 110, a first gate insulating layer 122 covering the first semiconductor layer, a first gate conductive layer G1 and G6 disposed on the first gate insulating layer 122, a second gate insulating layer 123 covering the first gate conductive layer, a second gate conductive layer CAE disposed on the second gate insulating layer 123, a first interlayer insulating layer 124 covering the second gate conductive layer, a first source-drain conductive layer ANDE1 disposed on the first interlayer insulating layer 124, a first planarization layer 125 covering the first source-drain conductive layer, a second source-drain conductive layer ANDE2 disposed on the first planarization layer 125, and a second planarization layer 126 covering the second source-drain conductive layer.

The circuit layer 120 may further include a buffer layer 121 covering the substrate 110. In this case, the first semiconductor layer may be disposed on the buffer layer 121.

The circuit layer 120 may include the light emitting pixel drivers EPD that are respectively electrically connected to the light emitting elements LE disposed in the emission areas EA, and wires for transmitting various signals and voltages to the light emitting pixel drivers EPD. Each of the light emitting pixel drivers EPD may include the first transistor T1 and two or more transistors T2 to T7 electrically connected to the first transistor T1.

The circuit layer 120 may further include the buffer layer 121 covering the substrate 110. In this case, the first semiconductor layer may be disposed on the buffer layer 121.

The circuit layer 120 may include the light emitting pixel drivers EPD that are respectively electrically connected to the light emitting elements LE disposed in the emission areas EA, and wires for transmitting various signals and voltages to the light emitting pixel drivers EPD. The light emitting pixel drivers EPD may include the first transistor T1 and two or more of the transistors T2 to T7 electrically connected to the first transistor T1.

According to embodiments, the first transistor T1 may include a channel portion CH1, a source portion S1, and a drain portion D1 disposed in the first semiconductor layer on the substrate 110, and a gate electrode G1 disposed in the first gate conductive layer on the first gate insulating layer 122 covering the first semiconductor layer. The source portion S1 and the drain portion D1 may be connected to both ends of the channel portion CH1. The source portion S1 and the drain portion D1 may be doped at a higher concentration than the channel portion CH1. The gate electrode G1 may overlap the channel portion CH1.

Similarly, the sixth transistor T6 may include a channel portion CH6, a source portion S6, and a drain portion D6 disposed in the first semiconductor layer on the substrate 110, and a gate electrode G6 disposed in the first gate conductive layer on the first gate insulating layer 122 covering the first semiconductor layer.

According to embodiments, the second to fifth transistors T2 to T5 and the seventh transistor T7 have substantially the same structure as the first transistor T1 and the sixth transistor T6, and therefore, redundant description will be omitted below.

The pixel capacitor PC1 may be provided as an overlapping area between the gate electrode G1 of the first transistor T1 and a pixel capacitor electrode CAE. The pixel capacitor electrode CAE may be disposed on a second gate conductive layer on a second gate insulating layer 123 covering the first gate conductive layer.

The anode electrode 131 of the element layer 130 may be electrically connected to the drain portion D6 of the sixth transistor T6 through a first anode connection electrode ANDE1 and a second anode connection electrode ANDE2.

The first anode connection electrode ANDE1 may be disposed on a first source-drain conductive layer on a first interlayer insulating layer 124 covering the second gate conductive layer. The first anode connection electrode ANDE1 may be electrically connected to the drain portion D6 of the sixth transistor T6 through a first anode contact hole ANCT1 penetrating the first interlayer insulating layer 124, the second gate insulating layer 123, and the first gate insulating layer 122.

The second anode connection electrode ANDE2 may be disposed on a second source-drain conductive layer on a first planarization layer 125 covering the first source-drain conductive layer. The second anode connection electrode ANDE2 may be electrically connected to the first anode connection electrode ANDE1 through a second anode contact hole ANCT2 penetrating the first planarization layer 125.

The element layer 130 may include the light emitting elements LE disposed on the second planarization layer 126 and respectively corresponding to the emission areas EA.

Each of the light emitting elements LE may include the anode electrode 131 and the cathode electrode 134 facing each other, and a light emitting layer 133 disposed therebetween.

Alternatively, each of the light emitting elements LE may further include a first common layer 135 disposed between the anode electrode 131 and the light emitting layer 133, and a second common layer 136 disposed between the light emitting layer 133 and the cathode electrode 134.

That is, the element layer 130 may include the anode electrodes 131 respectively corresponding to the emission areas EA, a pixel defining layer 132 corresponding to a non-emission area NEA and covering the edge of the anode electrode 131, light emitting layers 133 respectively disposed on the anode electrodes 131, and the cathode electrode 134 disposed on the light emitting layers 133 and the pixel defining layer 132.

The anode electrode 131 may be disposed in each of the emission areas EA and may be electrically connected to one light emitting pixel driver EPD of the circuit layer 120. This anode electrode 131 may be referred to as a pixel electrode.

The anode electrode 131 may be electrically connected to the second anode connection electrode ANDE2 through a third anode contact hole ANCT3 penetrating the second planarization layer 126.

The light emitting layer 133 may be formed of an organic light emitting material that converts electron-hole pairs into light.

The cathode electrode 134 may be disposed on the pixel defining layer 132 and the light emitting layers 133 of the emission areas EA. The second power ELVSS may be applied to the cathode electrode 134. The cathode electrode 134 may be referred to as a common electrode.

The encapsulation layer 140 may be disposed on the circuit layer 120 and cover the element layer 130.

The encapsulation layer 140 may include a first encapsulation layer 141 disposed on the element layer 130 and made of an inorganic insulating material, a second encapsulation layer 142 disposed on the first encapsulation layer 141, overlapping the element layer 130, and made of an organic insulating material, and a third encapsulation layer 143 disposed on the first encapsulation layer 141, covering the second encapsulation layer 142, and made of an inorganic insulating material.

Figure 6:
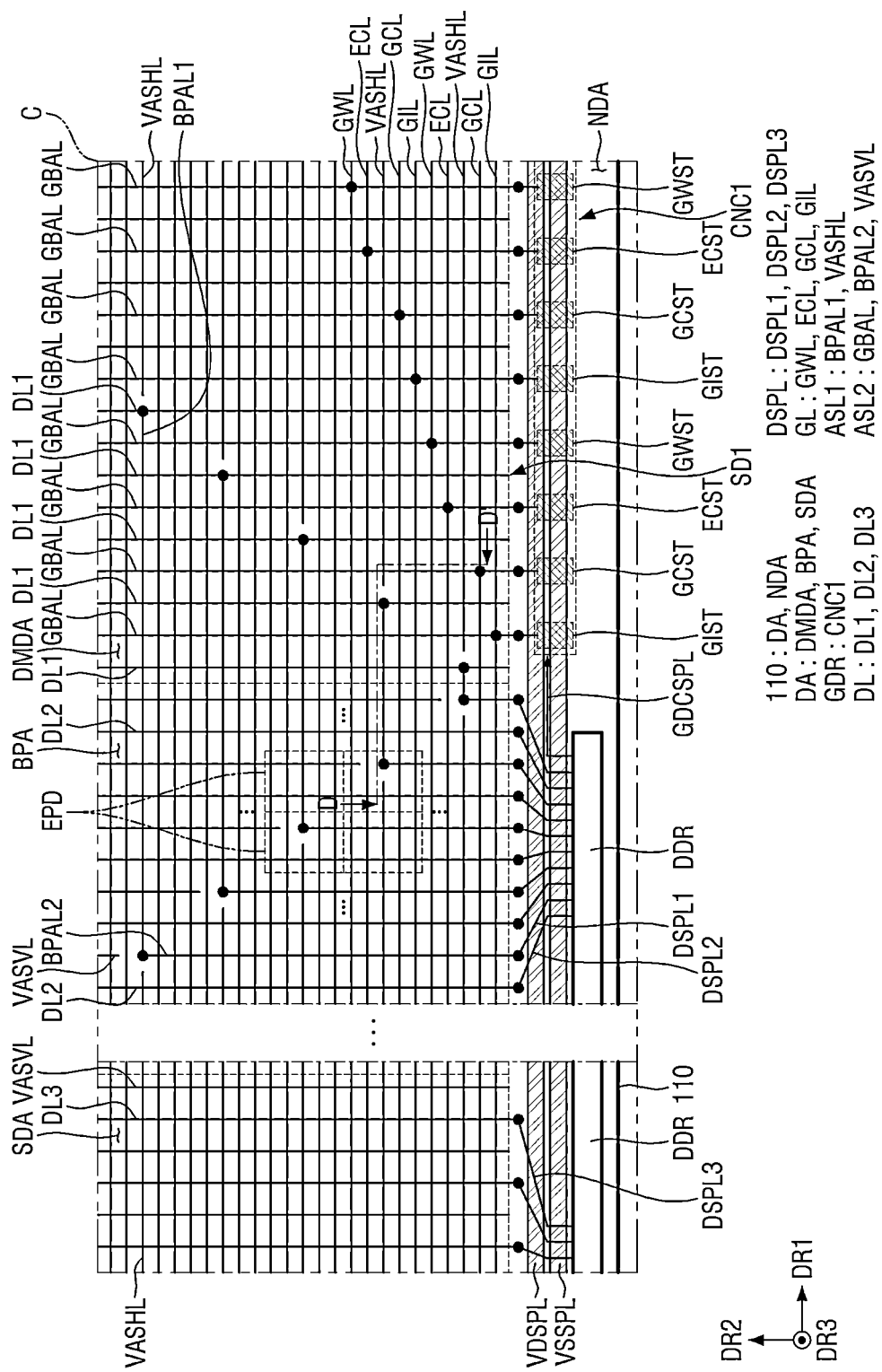
FIG. 6 is a layout diagram showing part C of FIG. 1.

FIG. 6 is a layout diagram showing part C of FIG. 1.

Referring to FIG. 6, the circuit layer 120 of the display device 100 according to one embodiment may include the light emitting pixel drivers EPD arranged in the first and second directions DR1 and DR2 and respectively electrically connected to the light emitting elements LE of the element layer 130; gate lines GL arranged in the second direction DR2 in the display area DA, extending in the first direction DR1, and for transmitting gate signals to the light emitting pixel drivers EPD; the gate driving circuit GDR including stages GIST, GCST, ECST, and GWST disposed in a portion of the non-display area NDA and electrically connected to the gate lines GL; the data lines DL extending in the second direction DR2 and for transmitting the data signal Vdata (see FIG. 5) to the light emitting pixel drivers EPD; first auxiliary lines ASL1 extending in the first direction DR1; and second auxiliary lines ASL2 extending in the second direction DR2 and adjacent to the data lines DL in the first direction DR1.

According to one embodiment, the second auxiliary lines ASL2 may include gate bypass auxiliary lines GBAL electrically connected between the stages GIST, GCST, ECST, and GWST of the gate driving circuit GDR arranged in the first direction DR1 and the gate lines GL.

According to one embodiment, the substrate 110 may include the display area DA where the emission areas EA are arranged, and the non-display area NDA disposed around the display area DA.

That is, the edge of the display area DA may be in contact with the non-display area NDA. The edge of the display area DA may include the first side SD1 extending in the first direction DR1.

According to one embodiment, the display driving circuit DDR and at least a part of the gate driving circuit GDR may be disposed in a portion of the non-display area NDA facing the first side SD1 of the display area DA.

The display driving circuit DDR may supply the data signal Vdata to the light emitting pixel drivers EPD through the data lines DL.

In addition, the display driving circuit DDR may supply gate driving control signals for controlling the output of the gate driving circuit GDR through a gate driving control supply line GDCSPL. The gate driving control signals may include at least one gate clock signal, at least one input carry signal, and the like.

The gate driving circuit GDR may include the stages GIST, GCST, ECST, and GWST electrically connected to the gate lines GL.

The gate lines GL collectively refer to wires connected to at least one gate electrode of the transistors T1 and T2 of the light emitting pixel driver EPD.

That is, the gate lines GL may include the scan write line GWL (see FIG. 4) for transmitting the scan write signal GW (see FIG. 4), the scan initialization line GIL (see FIG. 4) for transmitting the scan initialization signal GI (see FIG. 4), the gate control line GCL (see FIG. 4) for transmitting the gate control signal GC (see FIG. 4), and the emission control line ECL for transmitting the emission control signal EC (see FIG. 4).

Accordingly, the stages GIST, GCST, ECST, and GWST of the gate driving circuit GDR may include a scan write stage GWST electrically connected to the scan write line GWL, a scan initialization stage GIST electrically connected to the scan initialization line GIL, an emission control stage ECST electrically connected to the emission control line ECL, and a gate control stage GCST electrically connected to the gate control line GCL.

The gate driving circuit GDR may include the first center circuit portion CNC1 facing the central portion of the first side SD1 of the edge of the display area DA in the second direction DR2.

The first center circuit portion CNC1 may include the stages GIST, GCST, ECST, and GWST arranged in a direction (i.e., the first direction DR1) different from the arrangement direction (i.e., the second direction DR2) of the gate lines GL.

That is, the stages GIST, GCST, ECST, and GWST of the first center circuit portion CNC1 may be arranged in the first direction DR1, which is the extension direction of the gate lines GL.

According to one embodiment, the first center circuit portion CNC1 may include the scan write stage GWST, the scan initialization stage GIST, the emission control stage ECST, and the gate control stage GCST.

The display area DA may include the display middle region DMDA disposed in the central portion in the first direction DR1 to face the first center circuit portion CNC1 in the second direction DR2, and the bypass region BPA in contact with the display middle region DMDA in the first direction DR1.

Accordingly, the data lines DL may include a first data line DL1 disposed in the display middle region DMDA and extending in the second direction DR2, and a second data line DL2 disposed in the bypass region BPA and extending in the second direction DR2.

The first auxiliary lines ASL1 may include a first bypass auxiliary line BPAL1 electrically connected to the first data line DL1 of the display middle region DMDA.

The second auxiliary lines ASL2 may further include a second bypass auxiliary line BPAL2 adjacent to the second data line DL2 of the bypass region BPA in the first direction DR1, extending in the second direction DR2, and electrically connected to the first bypass auxiliary line BPAL1.

The gate bypass auxiliary lines GBAL of the second auxiliary lines ASL2 may be for implementing electrical connection between the gate lines GL and the stages of the first center circuit portion CNC1, and thus may be disposed in the display middle region DMDA facing the first center circuit portion CNC1.

That is, the first data line DL1 may be adjacent to one of the gate bypass auxiliary lines GBAL in the first direction DR1.

The display device 100 according to one embodiment may further include the display driving circuit DDR that supplies the data signal Vdata of the data lines DL.

According to one embodiment, the display driving circuit DDR may be mounted in a portion of the non-display area NDA of the substrate 110 facing the first side SD1 of the edge of the display area DA. The display driving circuit DDR may be spaced apart from the first center circuit portion CNC1 in the first direction DR1.

According to one embodiment, the circuit layer 120 may further include data supply lines DSPL electrically connected between the display driving circuit DDR and the data lines DL.

The data supply lines DSPL may be arranged in a portion of the non-display area NDA facing the first side SD1 of the edge of the display area DA, and may be spaced apart from the first center circuit portion CNC1 in the first direction DR1.

That is, the data supply lines DSPL may extend from the display driving circuit DDR to the remaining portion of the first side SD1 of the edge of the display area DA excluding a portion of the first side SD1 facing the first center circuit portion CNC1.

In other words, the data supply lines DSPL may extend from the display driving circuit DDR to the remaining regions of the display area DA excluding the display middle region DMDA.

According to one embodiment, the first data line DL1 disposed in the display middle region DMDA may be electrically connected to the second bypass auxiliary line BPAL2 of the bypass region BPA through the first bypass auxiliary line BPAL1 extending in the first direction DR1.

Accordingly, among the data supply lines DSPL, a first data supply line DSPL1 for transmitting the data signal of the first data line DL1 may extend to the second bypass auxiliary line BPAL2 of the bypass region BPA, and be electrically connected to the first data line DL1 through the first bypass auxiliary line BPAL1 and the second bypass auxiliary line BPAL2.

On the other hand, among the data supply lines DSPL, a second data supply line DSPL2 for transmitting the data signal of the second data line DL2 may extend to the bypass region BPA and be electrically connected directly to the second data line DL2.

The first bypass auxiliary line BPAL1 may be disposed between the first data line DL1 and the second bypass auxiliary line BPAL2.

The second bypass auxiliary line BPAL2 may be disposed between the first data supply line DSPL1 and the first bypass auxiliary line BPAL1.

Accordingly, in order to reduce the visibility of the first bypass auxiliary line BPAL1 and the second bypass auxiliary line BPAL2, the first auxiliary lines ASL1 may further include power auxiliary horizontal lines VASHL, and the second auxiliary lines ASL2 may further include power auxiliary vertical lines VASVL.

That is, two of the power auxiliary horizontal lines VASHL may extend from opposite ends of the first bypass auxiliary line BPAL1 to the third side SD3 and the fourth side SD4 in the first direction DR1, respectively.

In addition, one of the power auxiliary vertical lines VASVL may extend from one end of the second bypass auxiliary line BPAL2 to the second side SD2 in the second direction DR2.

One of the first power ELVDD (see FIG. 4), the second power ELVSS (see FIG. 4), the gate initialization voltage VGINT (see FIG. 4), and the anode initialization voltage VAINT (see FIG. 4) may be applied to each of the power auxiliary horizontal lines VASHL and the power auxiliary vertical lines VASVL.

In this way, constant voltages such as the first power ELVDD (see FIG. 4), the second power ELVSS (see FIG. 4), the gate initialization voltage VGINT (see FIG. 4), and the anode initialization voltage VAINT (see FIG. 4) may be stably maintained in the display area DA by the power auxiliary horizontal lines VASHL and the power auxiliary vertical lines VASVL.

Meanwhile, according to one embodiment, the display area DA may further include the side region SDA disposed between the bypass region BPA and the non-display area NDA in the first direction DR1.

In this case, the data lines DL may further include a third data line DL3 disposed in the side region SDA and extending in the second direction DR2.

The data supply lines DSPL may extend to the bypass region BPA and the side region SDA.

Accordingly, among the data supply lines DSPL, a third data supply line DSPL3 for transmitting the data signal of the third data line DL3 may extend to the side region SDA and be electrically connected directly to the second data line DL2.

The third data line DL3 may be adjacent to one of the power auxiliary vertical lines VASVL in the first direction DR1.

In addition, the circuit layer 120 may further include a first power supply line VDSPL and a second power supply line VSSPL for transmitting the first power ELVDD (see FIG. 4) and the second power ELVSS (see FIG. 4), respectively, for driving the light emitting elements of the element layer 130.

The first power supply line VDSPL and the second power supply line VSSPL may be disposed in the non-display area NDA. At least one of the first power supply line VDSPL or the second power supply line VSSPL may be disposed to surround the periphery of the display area DA.

Figure 7:
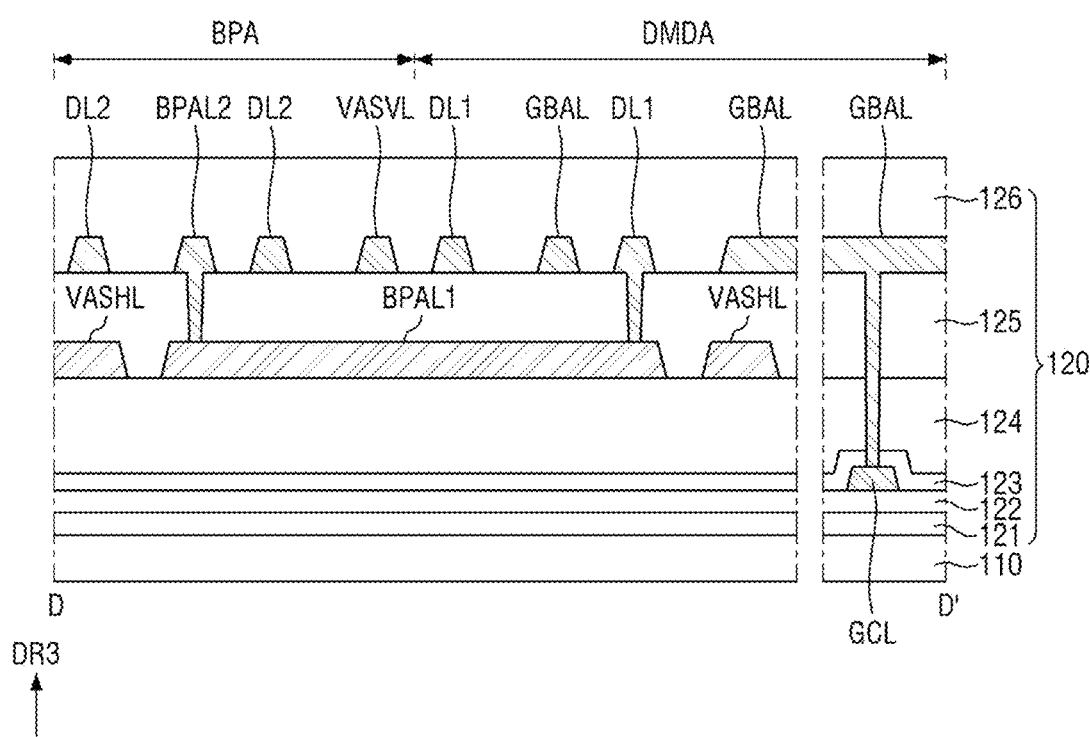
FIG. 7 is a cross-sectional view taken along line D-D' of FIG. 6.

FIG. 7 is a cross-sectional view taken along line D-D' of FIG. 6.

As shown in FIG. 7, according to one embodiment, the data lines DL (DL1, DL2, and DL3) and the second auxiliary lines ASL2 (BPAL2, GBAL, and VASVL) may be disposed on an insulating layer (e.g., the first planarization layer 125) covering the first auxiliary lines ASL1 (BPAL1 and VASHL).

In one example, the first auxiliary lines ASL1 (BPAL1 and VASHL) may be disposed in the first source-drain conductive layer on the first interlayer insulating layer 124, and the data lines DL and the second auxiliary lines ASL2 (BPAL2, GBAL, and VASVL) may be disposed in the second source-drain conductive layer on the first planarization layer 125 covering the first source-drain conductive layer.

The first bypass auxiliary line BPAL1 may be electrically connected to each of the second bypass auxiliary line BPAL2 and the first data line DL1 through a connection hole penetrating the first planarization layer 125.

According to one embodiment, each of the gate lines GL (GWL, GIL, GCL, and ECL) may be disposed in the first gate conductive layer on the first gate insulating layer 122 or in the second gate conductive layer on the second gate insulating layer 123.

In one example, the gate control line GCL of the gate lines GL may be disposed in the first gate conductive layer on the first gate insulating layer 122. In this case, the gate bypass auxiliary line GBAL of the second auxiliary lines ASL2 may be electrically connected to the gate control line GCL through a connection hole penetrating the first planarization layer 125, the first interlayer insulating layer 124, and the second gate insulating layer 123.

However, the illustration in FIG. 7 is merely an example, and each of the gate lines GL (GWL, GIL, GCL, and ECL) may be disposed in at least one of the first gate conductive layer on the first gate insulating layer 122, the second gate conductive layer on the second gate insulating layer 123, or the first source-drain conductive layer on the first interlayer insulating layer 124.

That is, any one gate line GL disposed in the second gate conductive layer on the second gate insulating layer 123 may be electrically connected to the gate bypass auxiliary line GBAL through a connection hole penetrating the first planarization layer 125 and the first interlayer insulating layer 124.

In addition, the gate electrode of each of the transistors T1 to T7 provided in each light emitting pixel driver EPD may be disposed in one of the first gate conductive layer on the first gate insulating layer 122 and the second gate conductive layer on the second gate insulating layer 123.

Some of the gate electrodes of the transistors T1 to T7 may be provided as a part of the gate line GL, and some others thereof may be electrically connected to the gate line GL through a connection hole.

Figure 8:
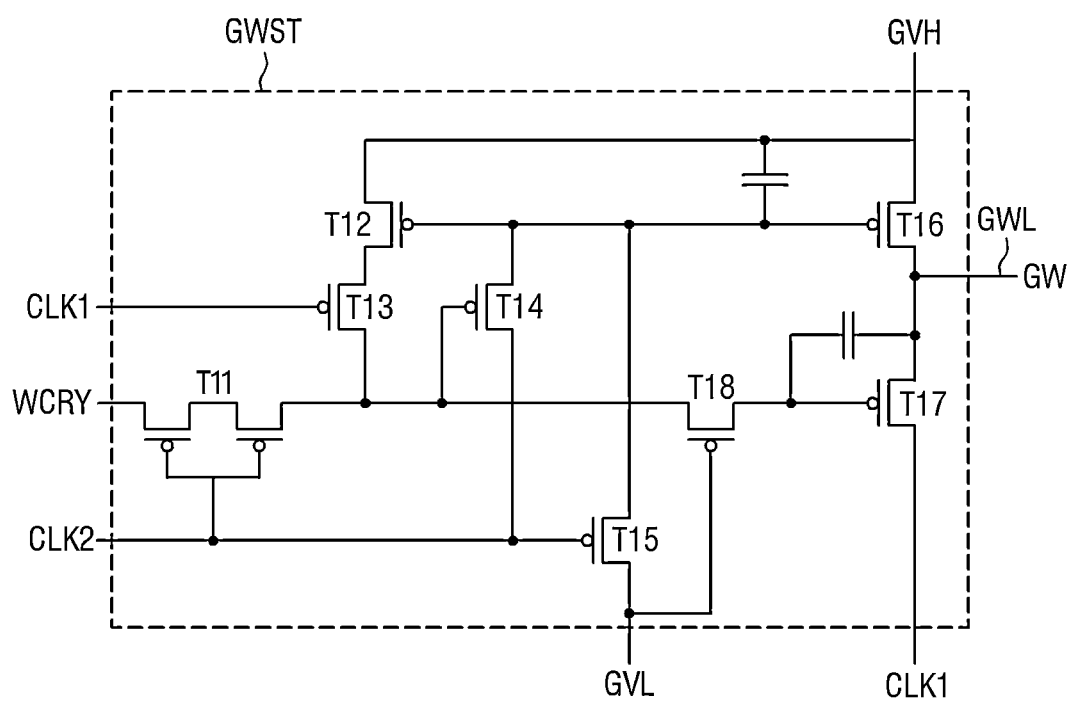
FIG. 8 is an equivalent circuit diagram showing the scan write stage of FIG. 6.

FIG. 8 is an equivalent circuit diagram showing the scan write stage of FIG. 6.

Referring to FIG. 8, the scan write stage GWST according to one embodiment may include eleventh to eighteenth transistors T11 to T18.

The sixteenth transistor T16 outputs the scan write signal GW at the first gate level voltage GVH, and the seventeenth transistor T17 outputs the scan write signal GW at the second gate level voltage GVL. The fourteenth transistor T14 and the fifteenth transistor T15 control the output through the sixteenth transistor T16.

The eleventh transistor T11, the twelfth transistor T12, and the thirteenth transistor T13 control the output through the seventeenth transistor T17.

The eighteenth transistor T18 controls the connection between the eleventh transistor T11, the twelfth transistor T12, the thirteenth transistor T13, and the seventeenth transistor T17.

The eleventh transistor T11 is turned on by the second gate clock signal CLK2. When the eleventh transistor T11 is turned on, an input carry signal WCRY of the scan write stage GWST may be transmitted to the second electrode of the thirteenth transistor T13, the gate electrode of the fourteenth transistor T14, and the first electrode of the eighteenth transistor T18.

The fourteenth transistor T14 is turned on by the write input carry signal WCRY. The second gate clock signal CLK2 may be applied to the first electrode of the fourteenth transistor T14, and the first gate level voltage GVH may be applied to the second electrode of the fourteenth transistor T14 through a capacitor. Accordingly, when the fourteenth transistor T14 is turned on, the potential of the second electrode of the fourteenth transistor T14 may be changed to the high voltage of the clock signal.

The twelfth transistor T12 may be turned on according to the potential of the second electrode of the fourteenth transistor T14. The first gate level voltage GVH may be applied to the first electrode of the twelfth transistor T12, and the second electrode of the twelfth transistor T12 may be connected to the first electrode of the thirteenth transistor T13.

The thirteenth transistor T13 is turned on according to the first gate clock signal CLK1.

Accordingly, when the potential of the second electrode of the fourteenth transistor T14 has a low voltage and the first gate clock signal CLK1 has a low voltage, the potential of the second electrode of the thirteenth transistor T13 may be changed to the first gate level voltage GVH.

The fifteenth transistor T15 may be turned on when the second gate clock signal CLK2 has a low voltage.

The sixteenth transistor T16 may be turned on when the fifteenth transistor T15 is turned on and the potential of the second electrode of the fourteenth transistor T14 becomes the second gate level voltage GVL. In this case, the output terminal of the scan write stage GWST may output the first gate level voltage GVH.

However, the illustration in FIG. 8 is merely an example, and the scan write stage GWST of the gate driving circuit GDR according to one embodiment is not limited to the illustration in FIG. 8.

Figure 9:
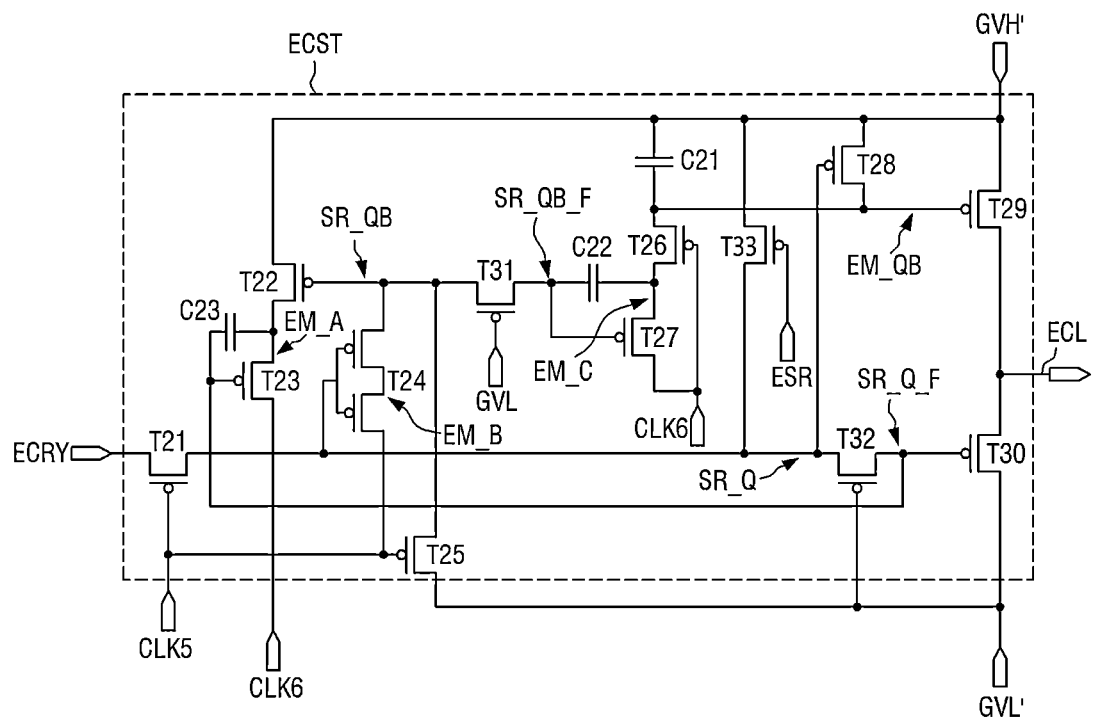
FIG. 9 is an equivalent circuit diagram showing the emission control stage of FIG. 6.

FIG. 9 is an equivalent circuit diagram showing the emission control stage of FIG. 6.

Referring to FIG. 9, the emission control stage ECST according to one embodiment may include twenty-first to thirty-third transistors T21 to T33.

The twenty-ninth transistor T29 outputs the emission control signal EC at the third gate level voltage GVH'.

The output of the twenty-ninth transistor T29 may be controlled by a voltage of a first node EM_QB.

The twenty-sixth transistor T26, the twenty-seventh transistor T27, and the twenty-eighth transistor T28 control the voltage of the first node EM_QB.

The twenty-sixth transistor T26 and the twenty-seventh transistor T27 are controlled by a voltage of a third-first node SR_QB_F.

Since the third-first node SR_QB_F is connected to a third node SR_QB through the thirty-first transistor T31, the twenty-sixth transistor T26 and the twenty-seventh transistor T27 may be controlled by the voltage of the third node SR_QB.

The twenty-fourth transistor T24 and the twenty-fifth transistor T25 control the voltage of the third node SR_QB.

The thirtieth transistor T30 outputs the emission control signal EC at the fourth gate level voltage GVL'.

The output of the thirtieth transistor T30 may be controlled by a voltage of a second node SR_Q.

The thirty-second transistor T32 controls the connection between the thirtieth transistor T30 and the second node SR_Q.

The third gate level voltage GVH' is applied to the first electrode of the twenty-ninth transistor T29, and the second electrode thereof is connected to the output terminal of the emission control stage ECST. Accordingly, when the potential of the first node EM_QB has a low voltage, the emission control signal EC may be outputted at the third gate level voltage GVH' through the twenty-ninth transistor T29.

The fourth gate level voltage GVL' is applied to the first electrode of the thirtieth transistor T30, and the second electrode thereof is connected to the output terminal of the emission control stage ECST. Accordingly, when a potential of a second-first node SR_Q_F has a low voltage, the emission control signal EC may be outputted at the fourth gate level voltage GVL' through the thirtieth transistor T30.

On the other hand, when the potential of the second-first node SR_Q_F has a high voltage, the thirtieth transistor T30 has no output.

The third gate level voltage GVH' is applied to the first electrode of the twenty-eighth transistor T28, the second electrode thereof is connected to the first node EM_QB, and the gate electrode thereof is connected to the second node SR_Q. Accordingly, when the second node SR_Q has a low voltage, the third gate level voltage GVH' may be transmitted to the first node EM_QB through the twenty-eighth transistor T28.

The twenty-first capacitor C21 may store the voltage of the first node EM_QB.

A sixth gate clock signal CLK6 may be applied to the gate electrode of the twenty-sixth transistor T26, the first electrode thereof may be connected to a fourth node EM_C, and the second electrode thereof may be connected to the first node EM_QB.

The gate electrode of the twenty-seventh transistor T27 is connected to the third-first node SR_QB_F, the sixth gate clock signal CLK6 is applied to the first electrode thereof, and the second electrode thereof is connected to the fourth node EM_C. Due to the twenty-sixth transistor T26 and the twenty-seventh transistor T27, when the potential of the third node SR_QB and the sixth gate clock signal CLK6 have a low voltage, the potential of the first node EM_QB may be changed to the low voltage of the sixth gate clock signal CLK6.

A fifth gate clock signal CLK5 is applied to the gate electrode of the twenty-first transistor T21, the emission carry input signal ECRY is inputted to the first electrode thereof, and the second electrode thereof is connected to the second node SR_Q. Accordingly, due to the twenty-first transistor T21, when the fifth gate clock signal CLK5 has a low voltage, the potential of the second node SR_Q may be changed to the emission carry input signal ECRY.

Since the fourth gate level voltage GVL' is applied to the gate electrode of the thirty-second transistor T32, the potential of the second-first node SR_Q_F may be maintained at the same level as the potential of the second node SR_Q due to the thirty-second transistor T32 in a turn-on state.

The gate-on signal ESR is applied to the gate electrode of the thirty-third transistor T33, the third gate level voltage GVH' is applied to the first electrode thereof, and the second electrode thereof is connected to the second node SR_Q. In this way, due to the thirty-third transistor T33 maintained in the turn-on state, the potential of the second node SR_Q may be maintained at the third gate level voltage GVH'.

The gate electrode of the twenty-second transistor T22 is connected to the third node SR_QB, the third gate level voltage GVH' is applied to the first electrode thereof, and the second electrode thereof is connected to a fifth node EM_A.

The gate electrode of the twenty-third transistor T23 is connected to the second-first node SR_Q_F, the sixth gate clock signal CLK6 is applied to the first electrode thereof, and the second electrode thereof is connected to the fifth node EM_A.

Due to the twenty-second transistor T22 and the twenty-third transistor T23, when the potentials of both the sixth gate clock signal CLK6 and the third node SR_QB have a low voltage, the potential of the second node SR_Q may be changed to a high voltage.

The gate electrode of the twenty-fourth transistor T24 is connected to the second node SR_Q, the fifth gate clock signal CLK5 is applied to the first electrode thereof, and the second electrode thereof is connected to the third node SR_QB. The twenty-fourth transistor T24 may include two sub-transistors connected in series.

The fifth gate clock signal CLK5 is applied to the gate electrode of the twenty-fifth transistor T25, the fourth gate level voltage GVL' is applied to the first electrode thereof, and the second electrode thereof is connected to the third node SR_QB.

Accordingly, due to the twenty-fifth transistor T25, the potential of the third node SR_QB may become the fourth gate level voltage GVL'. Further, due to the twenty-fourth transistor T24, when the potential of the second node SR_Q has a low voltage, the voltage of the third node SR_QB may be changed to the voltage of the fifth gate clock signal CLK5.

However, the illustration in FIG. 9 is merely an example, and the emission control stage ECST of the gate driving circuit GDR according to one embodiment is not limited to the illustration in FIG. 9.

In addition, each of the scan initialization stage GIST and the gate control stage GCST of the gate driving circuit GDR is similar to the scan write stage GWST of FIG. 8 or the emission control stage ECST of FIG. 9, and therefore redundant description will be omitted below.

As described above, the display device 100 according to one embodiment includes the gate bypass auxiliary lines GBAL provided as a part of the second auxiliary lines ASL2 and adjacent to the data lines DL in the first direction DR1. Accordingly, even if the stages GWST, GIST, ECST, and GCST of the gate driving circuit GDR are arranged in the first direction DR1 different from the arrangement direction of the gate lines GL, an electrical connection between the stages GWST, GIST, ECST, and GCST arranged in the first direction DR1 and the gate lines GL may be implemented by the gate bypass auxiliary lines GBAL.

Therefore, the gate driving circuit GDR may be disposed in a portion of the non-display area NDA facing the first side SD1 of the display area DA.

That is, a region where the gate driving circuit GDR is disposed may not be limited to a portion of the non-display area NDA facing the third side SD3 or the fourth side SD4 of the display area DA.

Accordingly, with the gate bypass auxiliary lines GBAL, a portion where the gate driving circuit GDR is disposed may be designed more freely, which may be advantageous in reducing the width of the non-display area NDA.

In addition, since the length of the first side SD1 and the second side SD2 of the display area DA does not affect a separation distance between the gate lines GL and the gate driving circuit GDR, the signal of the gate lines GL may be stably supplied even if the width of the display area DA in the first direction DR1 is increased.

In addition, according to one embodiment, since the stages GWST, GIST, ECST, and GCST arranged in the first direction DR1, are opposite to the display middle region DMDA, the data supply lines DSPL electrically connected between the display driving circuit DDR and the data lines DL need to extend to the remaining regions of the display area DA excluding the display middle region DMDA, in order to avoid the stages GWST, GIST, ECST, and GCST arranged in the first direction DR1.

However, since the display device 100 according to one embodiment includes the first bypass auxiliary line BPAL1 provided as a part of the first auxiliary lines ASL1, and the second bypass auxiliary line BPAL2 provided as another part of the second auxiliary lines ASL2, the first data line DL1 of the display middle region DMDA may be electrically connected to the first data supply line DSPL1 through the first bypass auxiliary line BPAL1 and the second bypass auxiliary line BPAL2.

In addition, according to one embodiment, the gate bypass auxiliary lines GBAL and the second bypass auxiliary line BPAL2 are provided as a part of the second auxiliary lines ASL2 and adjacent to the data lines DL in the first direction DR1. In other words, there is no need to provide a separate conductive layer or a separate region for the arrangement of the gate bypass auxiliary lines GBAL and the second bypass auxiliary line BPAL2, which may be advantageous for slimming down and enhancing the resolution of the display device 100.

Meanwhile, according to one embodiment shown in FIG. 6, the gate bypass auxiliary lines GBAL of the second auxiliary lines ASL2 extend from the first center circuit portion CNC1 to the second side SD2 of the display area DA.

However, since the gate bypass auxiliary lines GBAL are intended to provide an electrical connection between the stages GWST, GIST, ECST, and GCST of the first center circuit portion CNC1 and the gate lines GL, they may not extend to the second side SD2.

Figure 10:
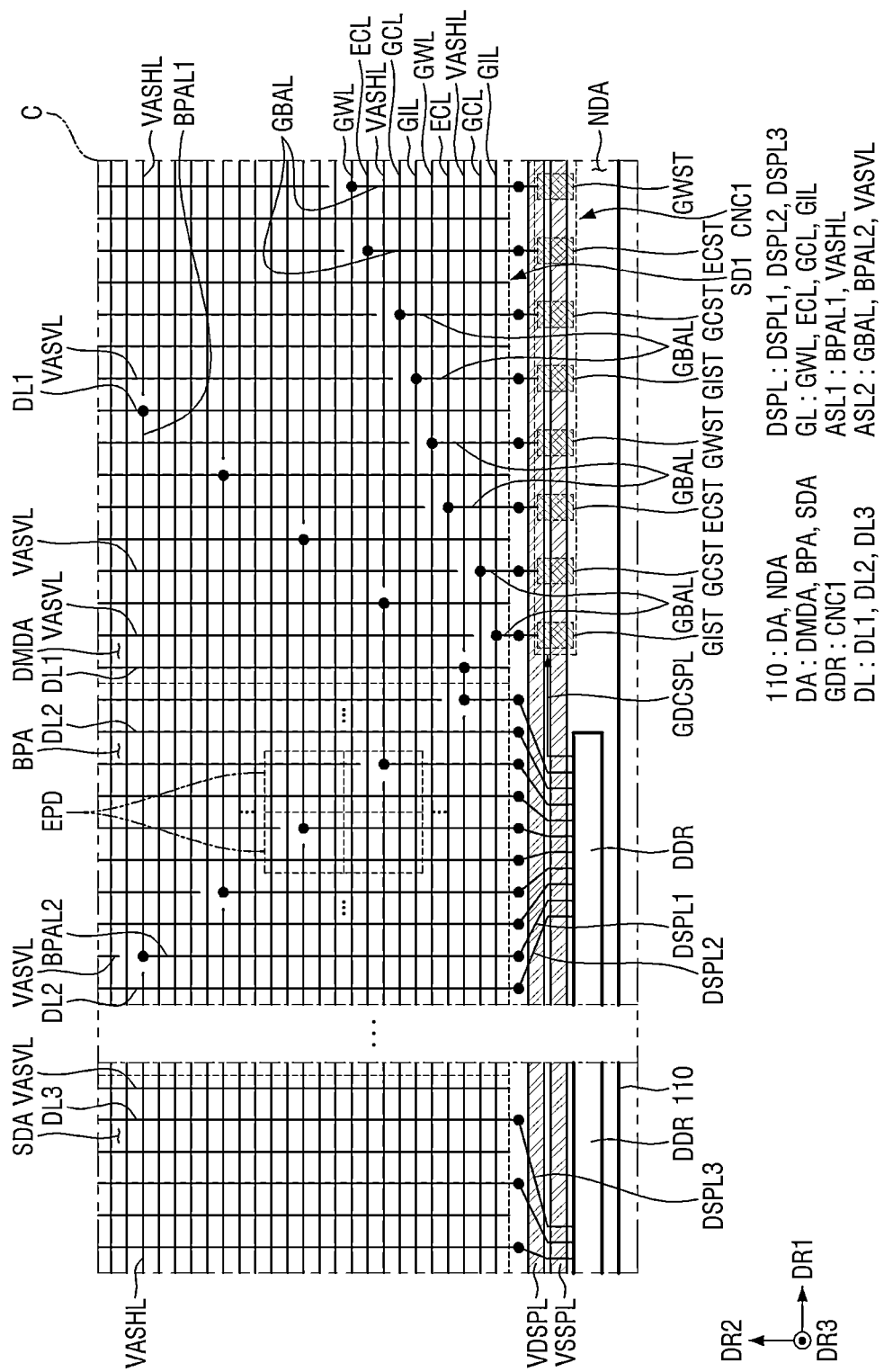
FIG. 10 is a layout diagram showing part C of FIG. 1 according to one embodiment.

FIG. 10 is a layout diagram showing part C of FIG. 1 according to one embodiment.

The display device 100 of one embodiment shown in FIG. 10 is substantially the same as that of one embodiment shown in FIG. 6, except that the gate bypass auxiliary lines GBAL extend from the first center circuit portion CNC1 up to the gate lines GL, respectively. Therefore, redundant description will be omitted below.

According to one embodiment of FIG. 10, one of the power auxiliary vertical lines VASVL may extend from one end of one gate bypass auxiliary line GBAL to the second side SD2.

In this way, the extension lengths of the gate bypass auxiliary lines GBAL may be reduced, and thus coupling defects caused by the gate bypass auxiliary lines GBAL may be reduced.

Figure 11:
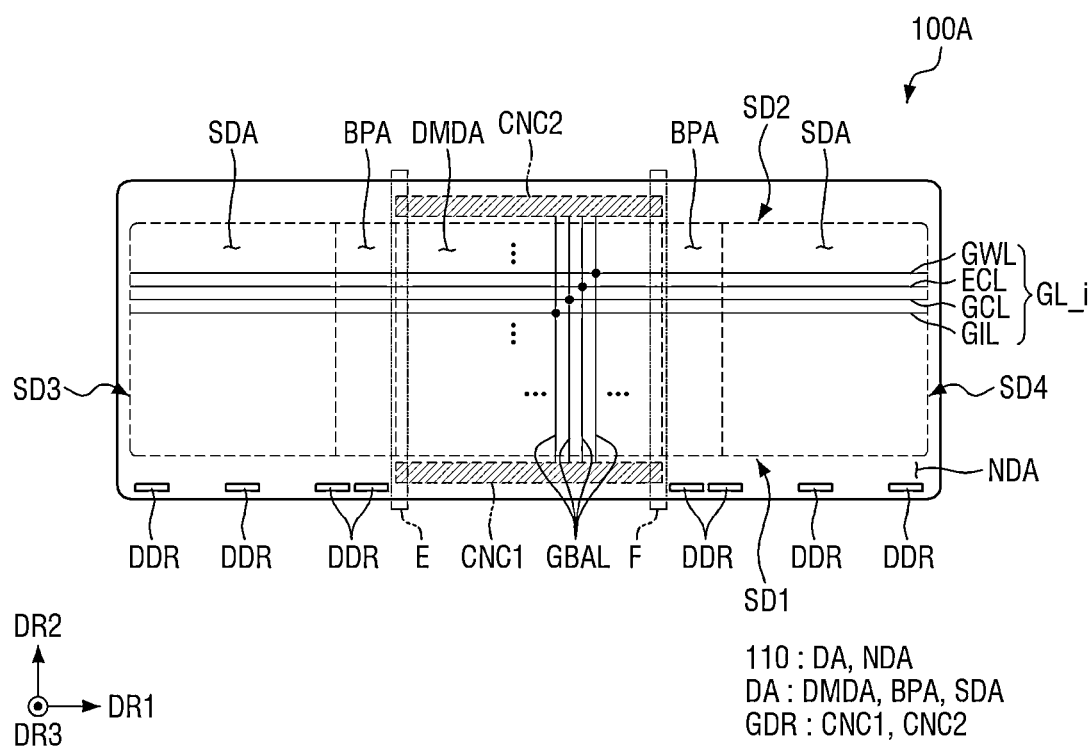
FIG. 11 is a plan view illustrating a display device according to one embodiment.
Figure 12:
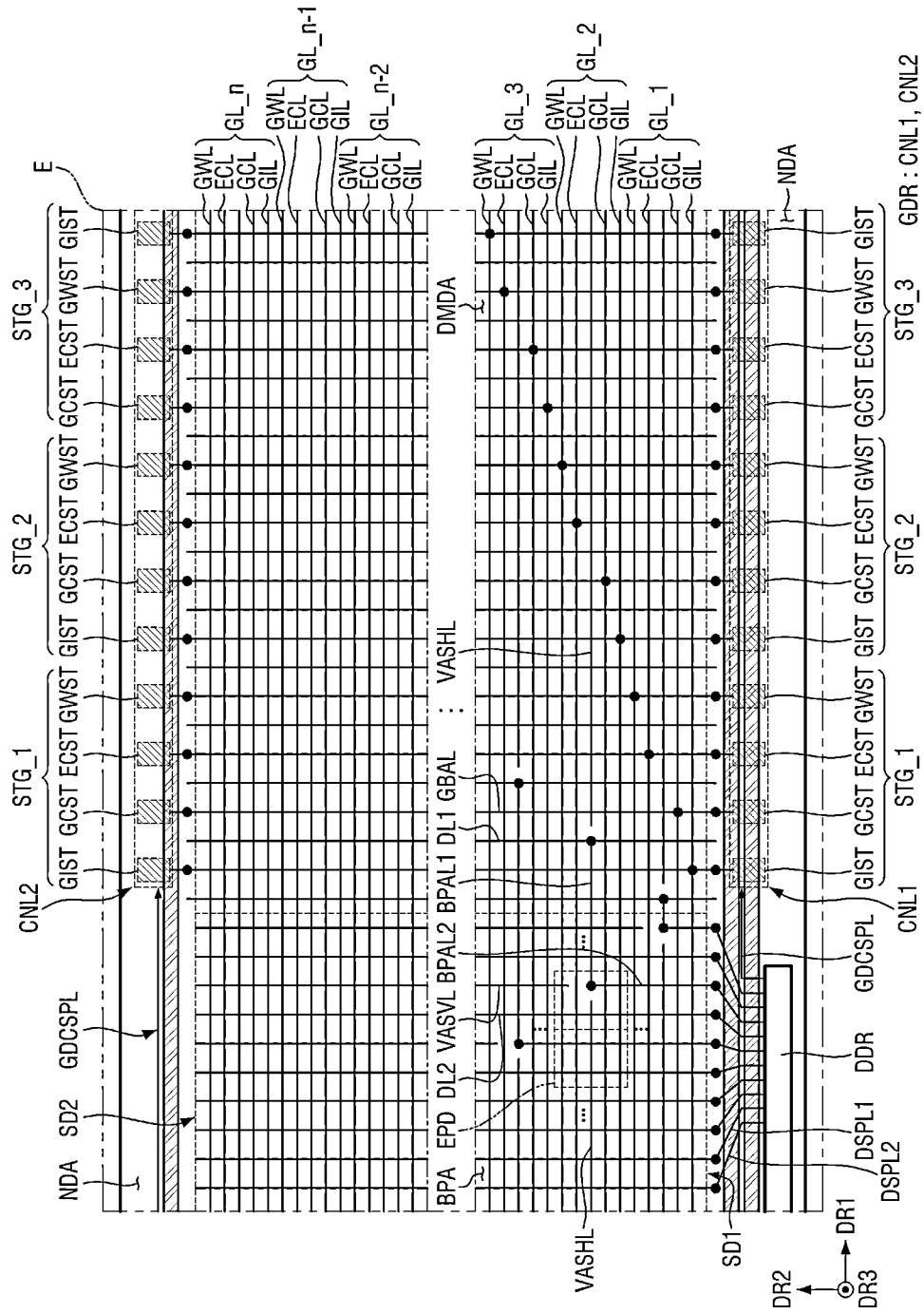
FIG. 12 is a layout diagram illustrating part E of FIG. 11.
Figure 13:
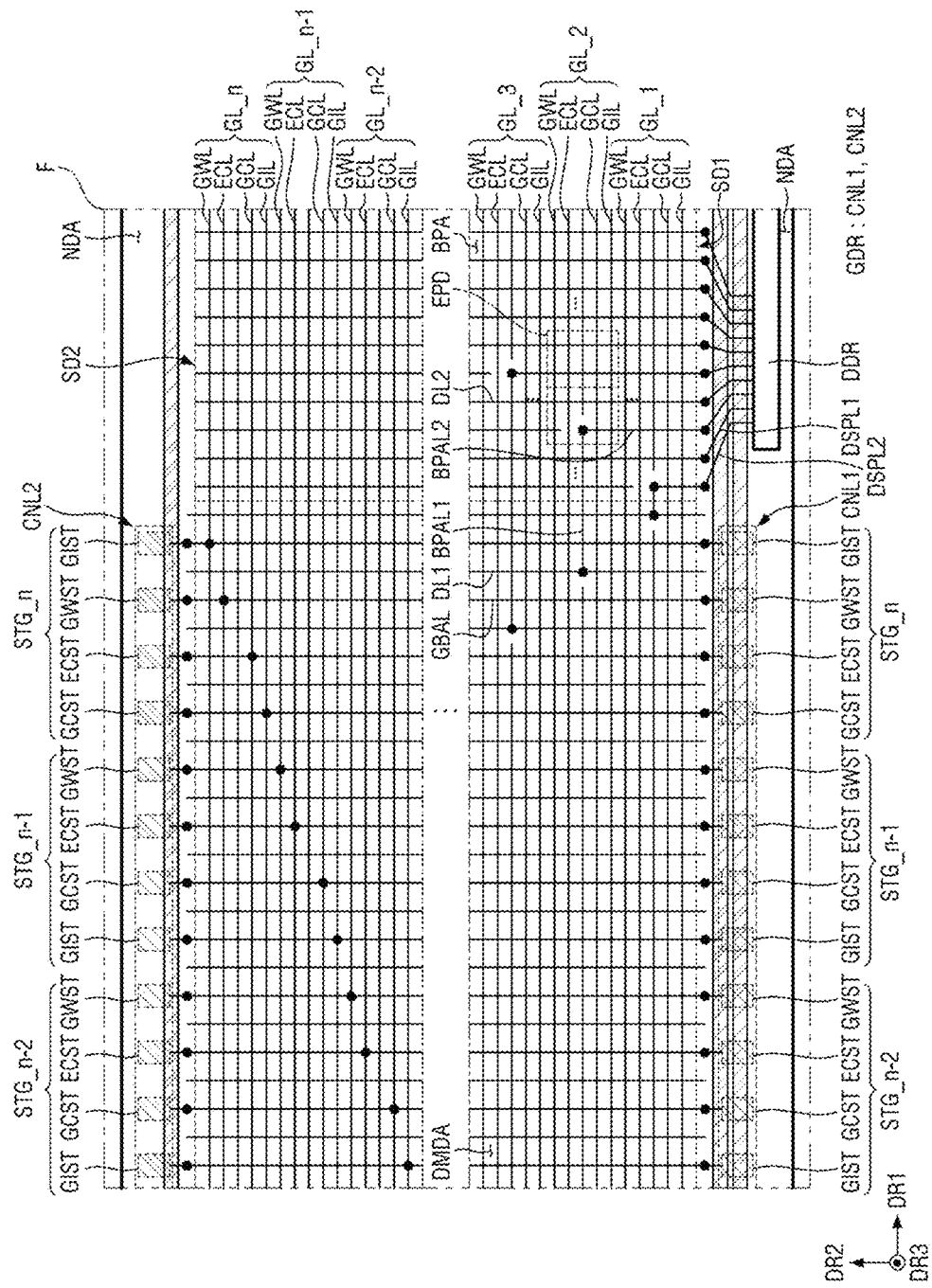
FIG. 13 is a layout diagram illustrating part F of FIG. 11.

FIG. 11 is a plan view illustrating a display device according to one embodiment. FIG. 12 is a layout diagram illustrating part E of FIG. 11. FIG. 13 is a layout diagram illustrating part F of FIG. 11.

A display device 100A of one embodiment shown in FIGS. 11, 12, and 13 is substantially the same as the display device 100 of one embodiment shown in FIGS. 1 to 10, except that the gate driving circuit GDR further includes a second center circuit portion CNC2 facing the central portion of the second side SD2 of the edge of the display area DA. Therefore, redundant description will be omitted below.

As shown in FIG. 11, according to one embodiment, the display middle region DMDA of the display area DA may be disposed between the first center circuit portion CNC1 and the second center circuit portion CNC2 in the second direction DR2. In an embodiment, the first center circuit portion CNC1 and the second center circuit portion CNC2 may face only the display middle region DMDA among the display middle region DMDA, the bypass region BPA, and the side region SDA in the second direction DR2.

As shown in FIGS. 12 and 13, the stages GWST, GIST, ECST, and GCST of the second center circuit portion CNC2 may be arranged in the first direction DR1 and may be electrically connected to the gate lines GL through the gate bypass auxiliary lines GBAL.

That is, according to one embodiment, each of the first center circuit portion CNC1 and the second center circuit portion CNC2 may include the scan write stage GWST, the scan initialization stage GIST, the emission control stage ECST, and the gate control stage GCST.

According to one embodiment, the display area DA may include n pixel rows, and each of the pixel rows may include the emission areas arranged in the first direction DR1. The circuit layer 120 may include gate line groups GL_1, GL_2, GL_3, GL_n-2, GL_n-1, and GL_n respectively corresponding to the pixel rows.

According to one embodiment, each of the gate line groups GL_1, GL_2, GL_3, GL_n-2, GL_n-1, and GL_n may include the scan write line GWL (see FIG. 4) for transmitting the scan write signal GW (see FIG. 4), the scan initialization line GIL (see FIG. 4) for transmitting the scan initialization signal GI (see FIG. 4), the gate control line GCL (see FIG. 4) for transmitting the gate control signal GC (see FIG. 4), and the emission control line ECL (see FIG. 4) for transmitting the emission control signal EC (see FIG. 4).

The gate line groups GL_1, GL_2, GL_3, GL_n-2, GL_n-1, and GL_n may be arranged in the second direction DR2 between the first side SD1 and the second side SD2.

The gate line groups GL_1, GL_2, GL_3, GL_n-2, GL_n-1, and GL_n may be connected one-to-one to stage groups STG_1, STG_2, STG_3, STG_n-2, STG_n-1, and STG_n of each of the first center circuit portion CNC1 and the second center circuit portion CNC2.

The stage groups STG_1, STG_2, STG_3, STG_n-2, STG_n-1, and STG_n of each of the first center circuit portion CNC1 and the second center circuit portion CNC2 may be arranged in the first direction DR1 between the third side SD3 and the fourth side SD4.

For example, as shown in FIG. 12, the gate line groups GL_1, GL_2, and GL_3 adjacent to the first side SD1 may be connected to the stage groups STG_1, STG_2, and STG_3 adjacent to the third side SD3.

In addition, as shown in FIG. 13, the gate line groups GL_n-2, GL_n-1, and GL_n adjacent to the second side SD2 may be connected to the stage groups STG_n-2, STG_n-1, and STG_n adjacent to the fourth side SD4.

In this way, the difference in wiring resistance due to a separation distance between each gate line GL and the first side SD1 may be reduced, and thus the difference in signal distortion of the gate lines GWL, ECL, GCL, and GIL may be reduced.

Figure 14:
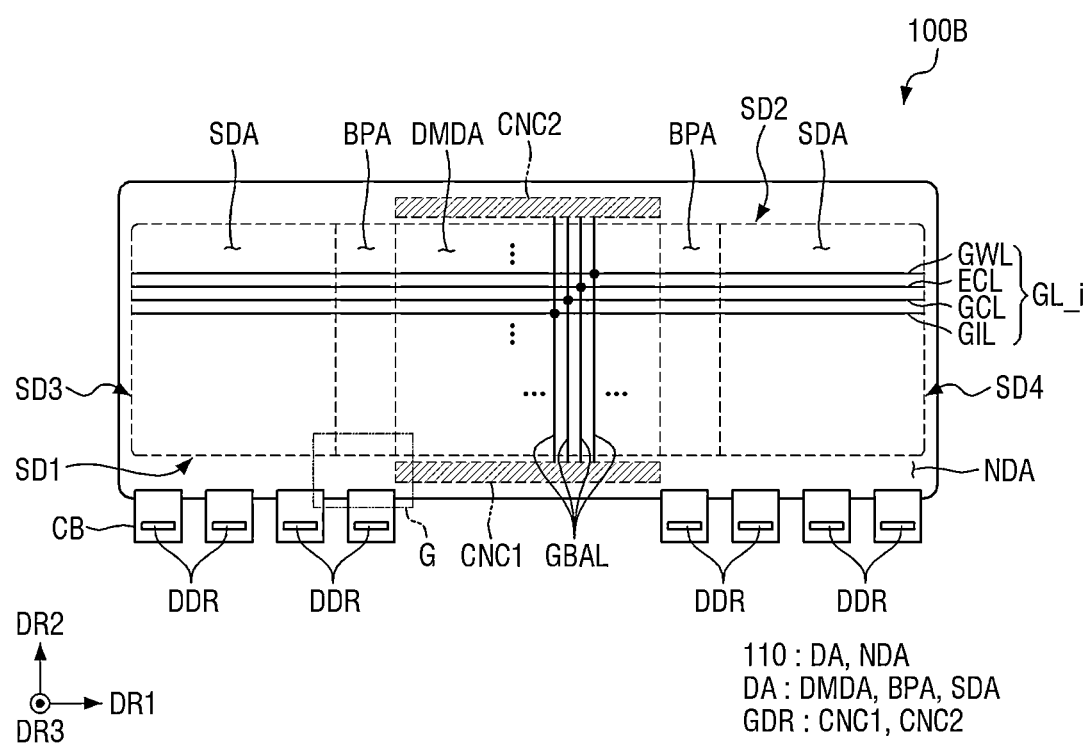
FIG. 14 is a plan view illustrating a display device according to one embodiment.
Figure 15:
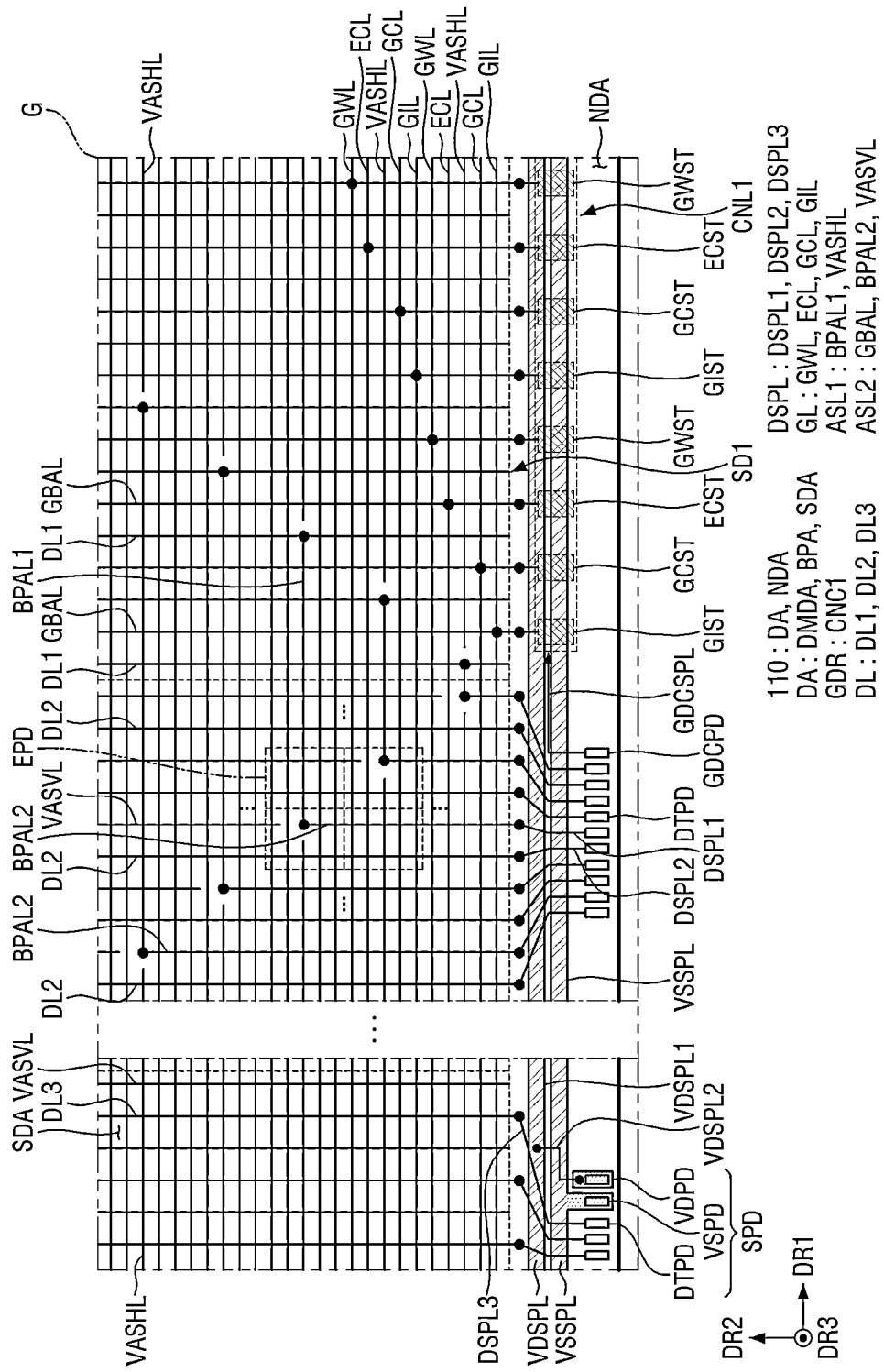
FIG. 15 is a layout diagram illustrating part G of FIG. 14.

FIG. 14 is a plan view illustrating a display device according to one embodiment. FIG. 15 is a layout diagram illustrating part G of FIG. 14.

A display device 100B of one embodiment shown in FIGS. 14 and 15 is substantially the same as the display device 100A of one embodiment shown in FIGS. 11 to 13, except that it further includes a circuit board CB on which the display driving circuit DDR is mounted, and signal pads SPD connected to the circuit board CB. Therefore, redundant description will be omitted below.

According to one embodiment, as the display driving circuit DDR is prepared as an integrated circuit (IC), the display driving circuit DDR may be mounted on the circuit board CB using a chip on film ("COF") method.

The circuit board CB may be electrically connected to the circuit layer 120 by being connected and bonded to the signal pads SPD arranged in the non-display area NDA of the substrate 110.

As shown in FIG. 15, the signal pads SPD may be disposed in a portion of the non-display area NDA of the substrate 110 facing the first side SD1 of the display area DA. The signal pads SPD may be spaced apart from the first center circuit portion CNC1 in the first direction DR1.

That is, in a portion of the non-display area NDA facing the first side SD1 of the display area DA, the signal pads SPD and the first center circuit portion CNC1 may be arranged in the first direction DR1.

The signal pads SPD may include a data pad DTPD for transmitting the data signal Vdata of the data lines DL, a first power pad VDPD for transmitting the first power ELVDD, a second power pad VSPD for transmitting the second power ELVSS, and a gate driving control pad GDCPD for transmitting the gate driving control signal.

The data supply lines DSPL may extend from the data pads DTPD to the bypass region BPA and the side region SDA beyond the first side SD1.

Figure 16:
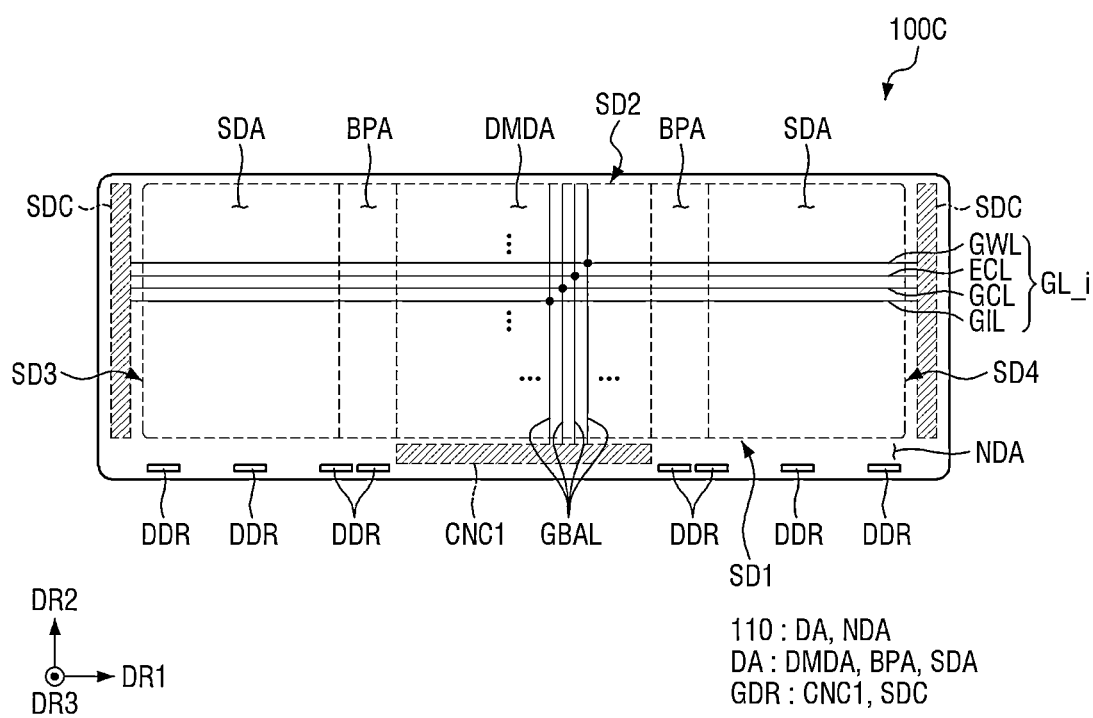
FIG. 16 is a plan view illustrating a display device according to one embodiment.

FIG. 16 is a plan view illustrating a display device according to one embodiment.

A display device 100C of one embodiment shown in FIG. 16 is substantially the same as the display device 100 of one embodiment shown in FIGS. 1 to 10, except that the gate driving circuit GDR further includes a side circuit portion SDC facing at least one of the third side SD3 or the fourth side SD4 of the display area DA. Therefore, redundant description will be omitted below.

As shown in FIG. 16, the gate lines GWL, ECL, GCL, and GIL included in any one gate line group GL_i (i is a natural number greater than or equal to 1 and less than or equal to n) among the gate line groups respectively corresponding to the pixel rows may be electrically connected to the first center circuit portion CNC1 through the gate bypass auxiliary lines GBAL, as well as extending in the first direction DR1 to be electrically connected to the side circuit portion SDC.

According to one embodiment of FIG. 16, each of the first center circuit portion CNC1 and the side circuit portion SDC may include the scan write stage GWST, the scan initialization stage GIST, the emission control stage ECST, and the gate control stage GCST.

In this way, even in a portion of the display area DA adjacent to the third side SD3 or the fourth side SD4 and spaced away from the gate bypass auxiliary line GBAL, the signals of the gate lines GWL, ECL, GCL, and GIL may be stably supplied by the side circuit portion SDC.

Figure 17:
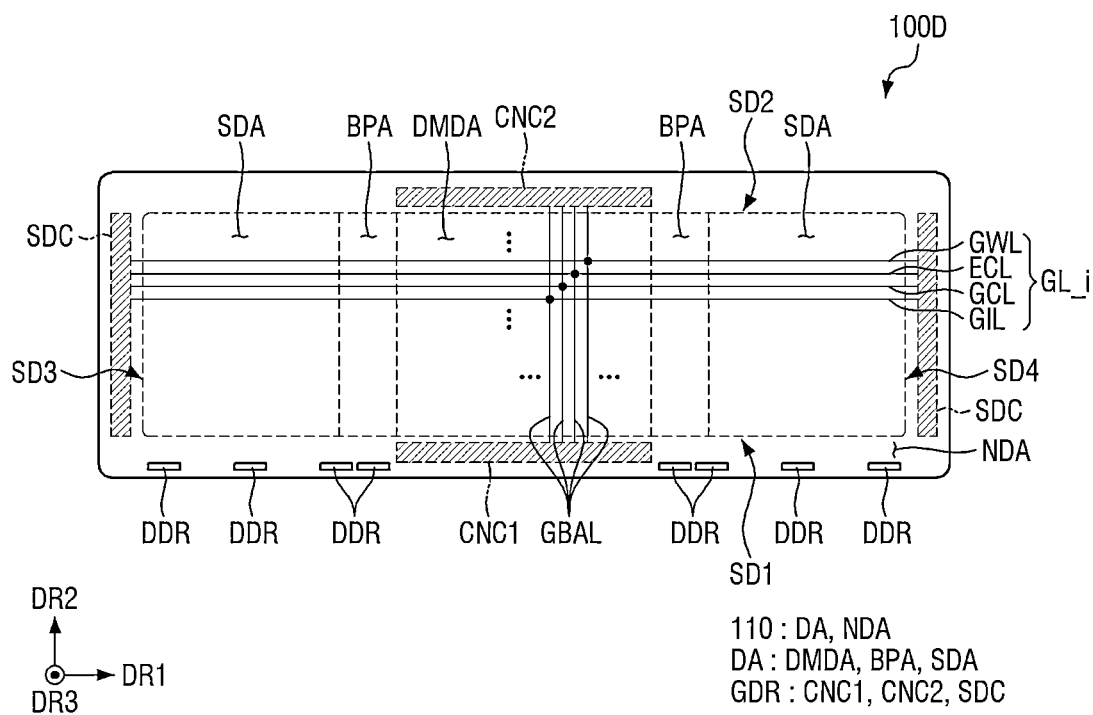
FIG. 17 is a plan view illustrating a display device according to one embodiment.

FIG. 17 is a plan view illustrating a display device according to one embodiment.

A display device 100D of one embodiment shown in FIG. 17 is substantially the same as the display device 100 of one embodiment shown in FIGS. 1 to 10, except that the gate driving circuit GDR further includes a second center circuit portion CNC2 facing the central portion of the second side SD2 of the display area DA, and a side circuit portion SDC facing at least one of the third side SD3 or the fourth side SD4 of the display area DA. Therefore, redundant description will be omitted below.

In this way, the deviation in a separation distance between each portion of the display area DA and the gate driving circuit GDR may be reduced, so that the signals of the gate lines GWL, ECL, GCL, and GIL may be more stably supplied in the entire display area DA.

Figure 18:
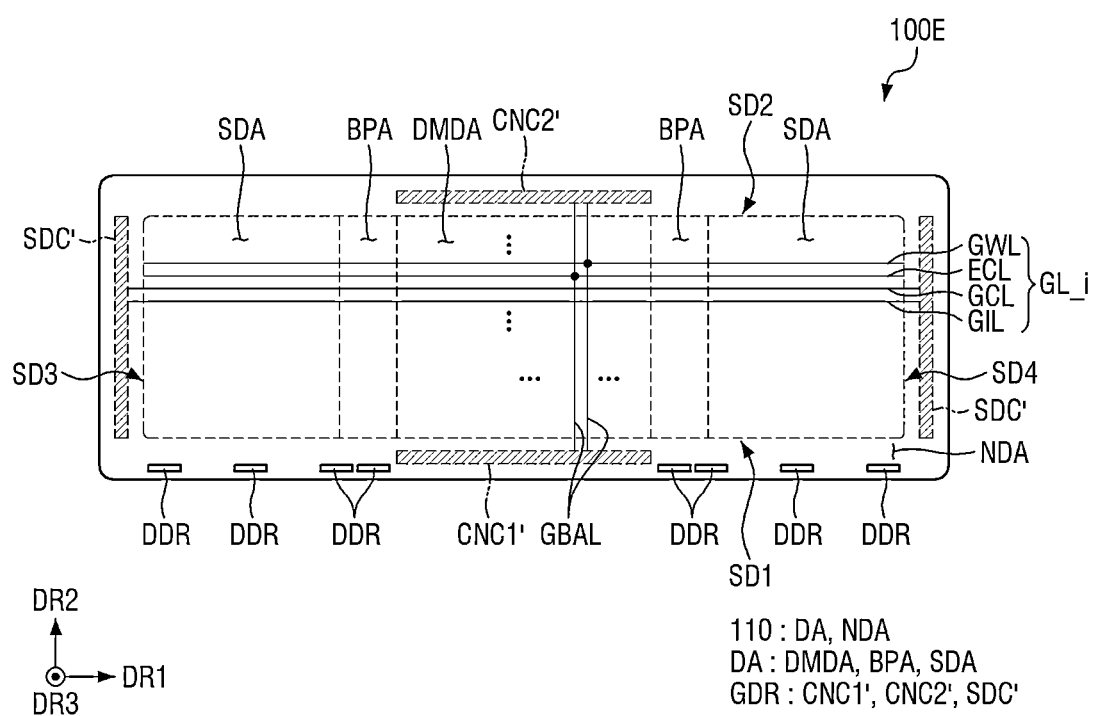
FIG. 18 is a plan view illustrating a display device according to one embodiment.

FIG. 18 is a plan view illustrating a display device according to one embodiment.

A display device 100E of one embodiment shown in FIG. 18 is substantially the same as the display device 100C of one embodiment shown in FIG. 16, except that the gate driving circuit GDR includes a first center circuit portion CNC1' and a side circuit portion SDC' including different stages. Therefore, redundant description will be omitted below.

As shown in FIG. 18, some of the write scan line GWL, the emission control line ECL, the gate control line GCL, and the scan initialization line GIL included in any one gate line group GL_i may be electrically connected to the first center circuit portion CNC1', and the others thereof may be electrically connected to the side circuit portion SDC'.

That is, the first center circuit portion CNC1' may include some of the scan write stage GWST, the scan initialization stage GIST, the emission control stage ECST, and the gate control stage GCST, and the side circuit portion SDC' may include the others of the scan write stage GWST, the scan initialization stage GIST, the emission control stage ECST, and the gate control stage GCST.

In one example, among the write scan line GWL, the emission control line ECL, the gate control line GCL, and the scan initialization line GIL included in any one gate line group GL_i, the write scan line GWL and the emission control line ECL may be electrically connected to the first center circuit portion CNC1', and the gate control line GCL and the scan initialization line GIL may be electrically connected to the side circuit portion SDC'.

However, the illustration in FIG. 18 is merely an example, and the electrical connection configurations between the write scan line GWL, the emission control line ECL, the gate control line GCL, and the scan initialization line GIL, and the first center circuit portion CNC1' and the side circuit portion SDC' may be altered differently from the illustration of FIG. 18.

In this way, since the first center circuit portion CNC1' and the side circuit portion SDC' do not include all stages, the arrangement area of each of the first center circuit portion CNC1' and the side circuit portion SDC' may be reduced. Accordingly, it may be advantageous to reduce the width of the non-display area NDA.

Figure 19:
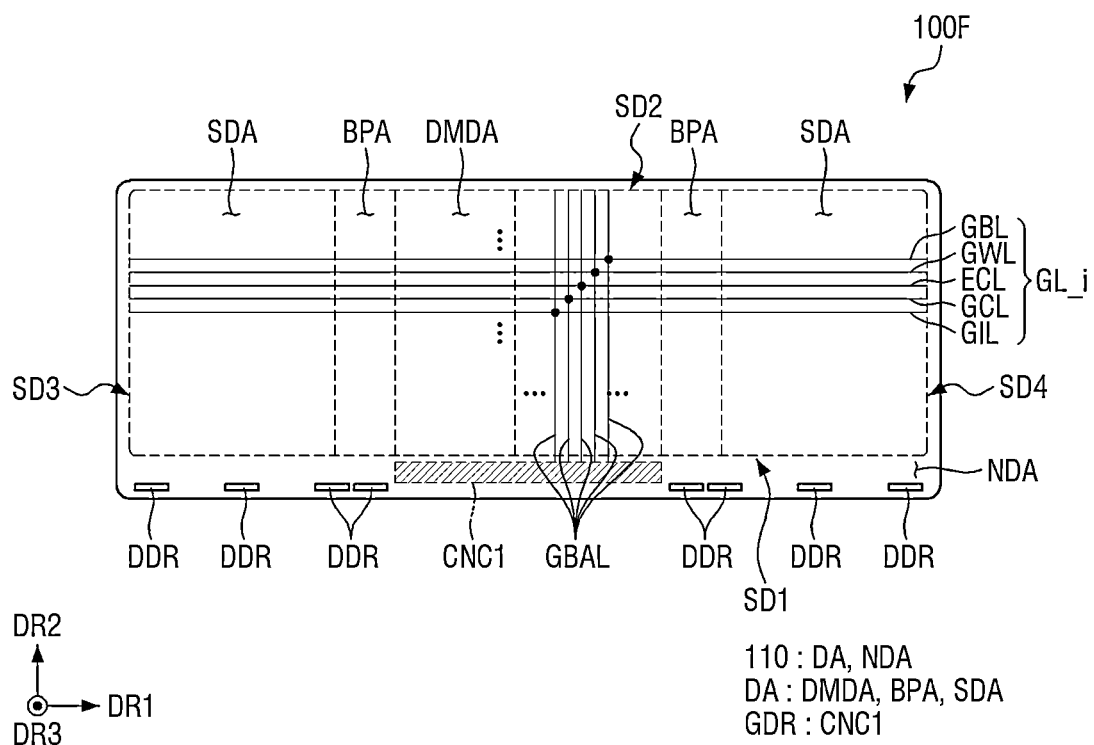
FIG. 19 is a plan view illustrating a display device according to one embodiment.
Figure 20:
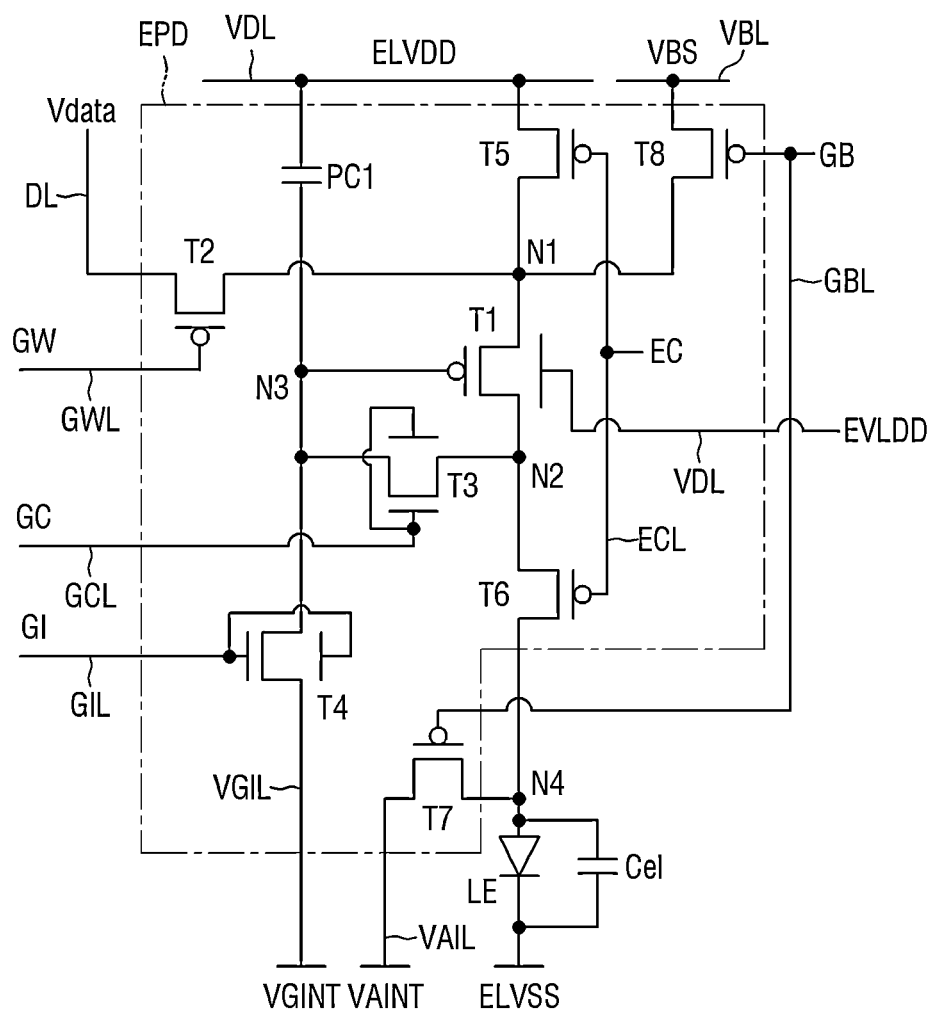
FIG. 20 is an equivalent circuit diagram showing a light emitting pixel driver according to the embodiment of FIG. 19.
Figure 21:
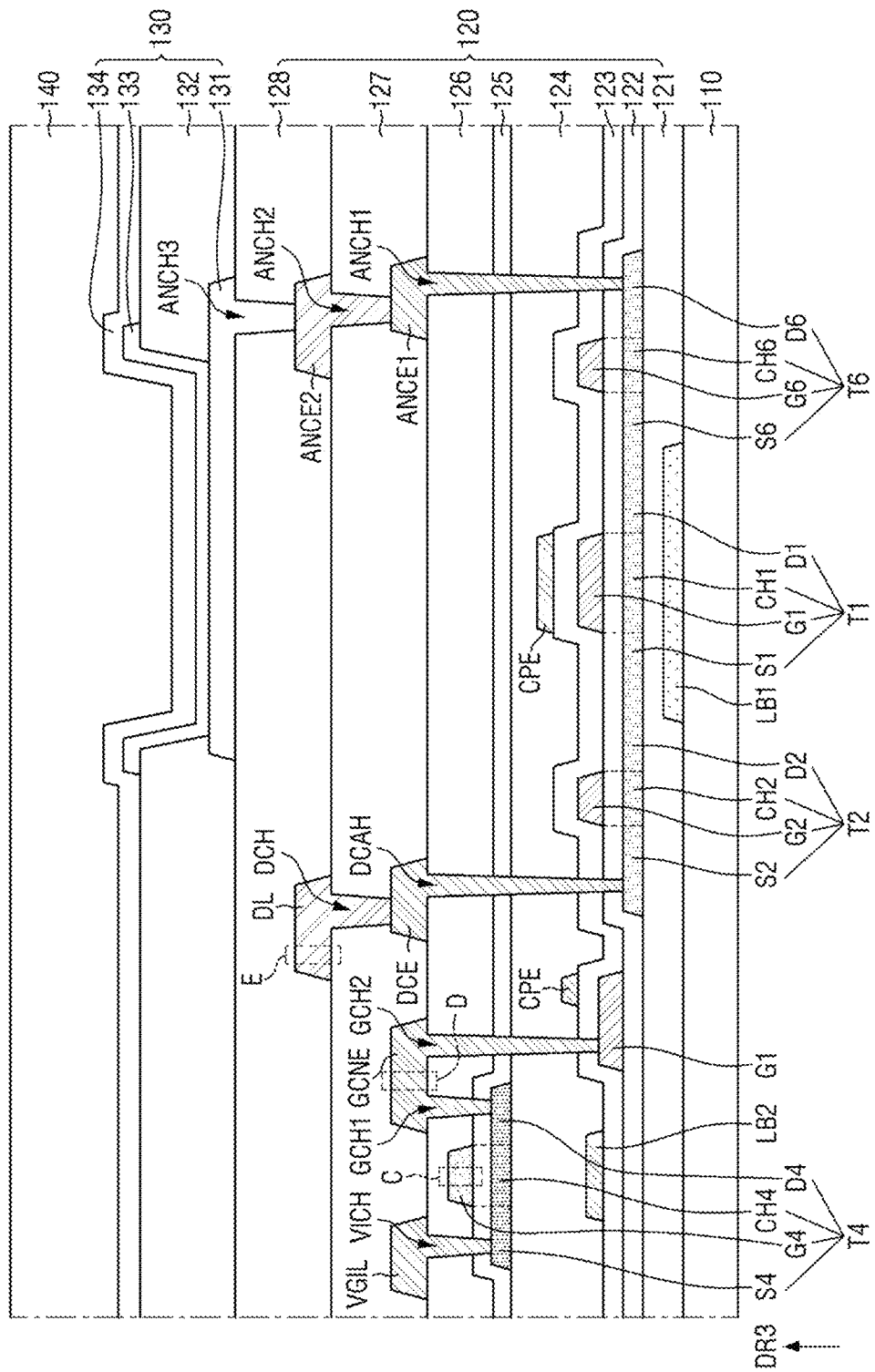
FIG. 21 is a cross-sectional view showing a first transistor, a second transistor, a sixth transistor, a fourth transistor, and a light emitting element of FIG. 20.

FIG. 19 is a plan view illustrating a display device according to one embodiment. FIG. 20 is an equivalent circuit diagram showing a light emitting pixel driver according to the embodiment of FIG. 19. FIG. 21 is a cross-sectional view showing a first transistor, a second transistor, a sixth transistor, a fourth transistor, and a light emitting element of FIG. 20.

A display device 100F of one embodiment shown in FIG. 19 is substantially the same as those of the embodiments shown in FIGS. 1 to 18, except that the gate lines GL further include a bias control line GBL for transmitting a bias control signal GB (see FIG. 20). Therefore, redundant description will be omitted below.

Referring to FIG. 20, the display device 100F of one embodiment shown in FIG. 19 is substantially the same as that of one embodiment shown in FIG. 4, except that the circuit layer 120 includes the bias control line GBL for transmitting the bias control signal GB and a bias voltage line VBL for transmitting a bias voltage VBS, each light emitting pixel driver EPD of the circuit layer 120 further includes an eighth transistor T8 electrically connected between the first node N1 and the bias voltage line VBL, and the third and fourth transistors T3 and T4 are provided as N-type MOSFETs. Therefore, redundant description will be omitted below.

The eighth transistor T8 may be turned on by the bias control signal GB of the bias control line GBL.

Unlike the second transistor T2, the third transistor T3 may be provided as an N-type MOSFET, and thus may be turned on by the gate control signal GC of the gate control line GCL.

The fourth transistor T4 may be turned on by the scan initialization signal GI of the scan initialization line GIL.

Unlike the fourth transistor T4, the seventh transistor T7 may be provided as a P-type MOSFET, and thus may be turned on by the bias control signal GB of the bias control line GBL.

According to FIG. 21, the circuit layer 120 is substantially similar to that of one embodiment of FIG. 5, except that it further includes a second semiconductor layer CH4, S4, and D4 disposed on the first interlayer insulating layer 124, a third gate insulating layer 127 covering the second semiconductor layer, a third gate conductive layer G4 disposed on the third gate insulating layer 127, and a second interlayer insulating layer 128 covering the third gate conductive layer. Therefore, redundant description will be omitted below.

In this case, the first source-drain conductive layer may be disposed on the second interlayer insulating layer 128.

The circuit layer 120 may further include a first light blocking layer LB1 overlapping the channel portion CH1 of the first transistor T1 of the first semiconductor layer, and a second light blocking layer LB2 overlapping a channel portion CH4 of the fourth transistor T4 of the second semiconductor layer.

The buffer layer 121 may cover the first light blocking layer LB1.

The second light blocking layer LB2 may be disposed in the second gate conductive layer.

The first source-drain conductive layer may further include the gate initialization voltage line VGIL, a gate connection electrode GCNE, and a data connection electrode DCE.

The gate initialization voltage line VGIL may be electrically connected to the source portion S4 of the fourth transistor T4 through an initialization connection hole VICH.

The gate connection electrode GCNE may be electrically connected to a drain portion D4 of the fourth transistor T4 and the gate electrode G1 of the first transistor T1 through a first gate connection hole GCH1 and a second gate connection hole GCH2, respectively.

The data line DL may be disposed in the second source-drain conductive layer and electrically connected to the data connection electrode DCE through a data connection hole DCH.

The data connection electrode DCE may be electrically connected to a source portion S2 of the second transistor T2 through a data auxiliary connection hole DCAH.

As described above, in the display device 100F of one embodiment shown in FIGS. 19, 20, and 21, the gate driving circuit GDR may be electrically connected to the bias control line GBL through the gate bypass auxiliary line GBAL.

The gate driving circuit GDR may include the first center circuit portion CNC1 facing the central portion of the first side SD1.

Alternatively, the gate driving circuit GDR may further include the second center circuit portion CNC2 facing the central portion of the second side SD2.

Alternatively, the gate driving circuit GDR may further include the side circuit portion SDC facing the third side SD3 or the fourth side SD4.

Each of the first center circuit portion CNC1, the second center circuit portion CNC2, and the side circuit portion SDC may be electrically connected to the scan write line GWL, the scan initialization line GIL, the gate control line GCL, the emission control line ECL, and the bias control line GBL.

Figure 22:
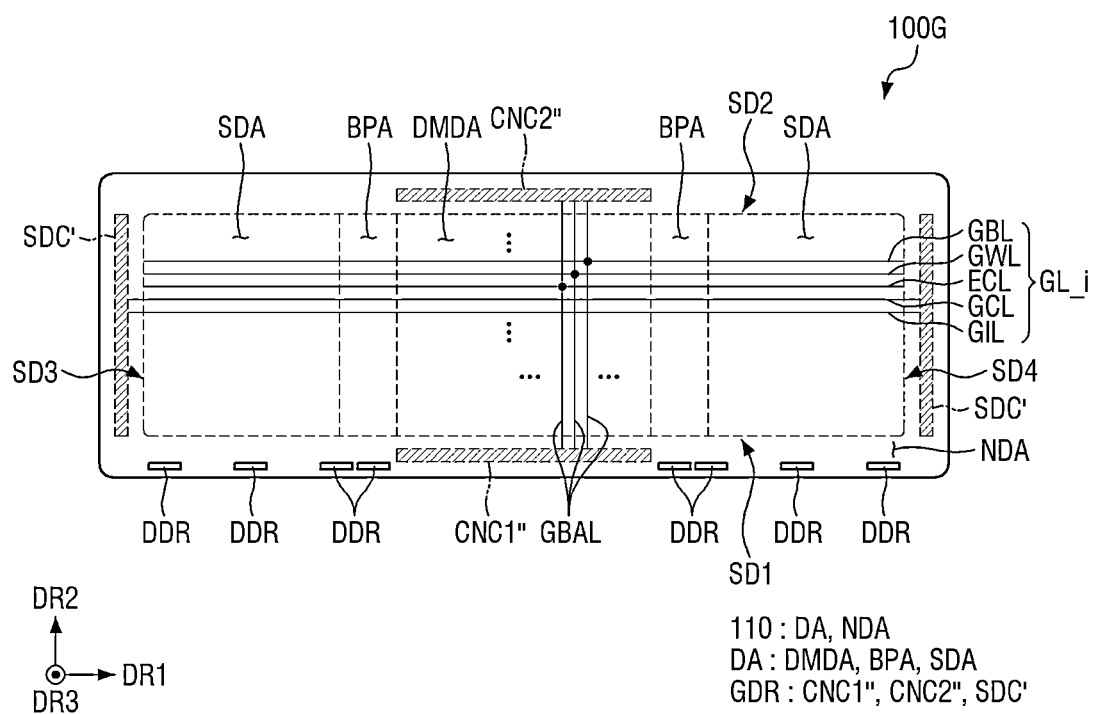
FIG. 22 is a plan view illustrating a display device according to one embodiment.

FIG. 22 is a plan view illustrating a display device according to one embodiment.

A display device 100G of one embodiment shown in FIG. 22 is substantially the same as the display device 100F of one embodiment shown in FIGS. 19, 20, and 21, except that some of the scan write line GWL, the scan initialization line GIL, the gate control line GCL, the emission control line ECL, and the bias control line GBL are electrically connected to a first center circuit portion CNC1" or a second center circuit portion CNC2", and the others thereof are electrically connected to a side circuit portion SDC'. Therefore, redundant description will be omitted below.

In this way, the arrangement width of each of the first center circuit portion CNC1" or the second center circuit portion CNC2" and the side circuit portion SDC' may be reduced, which may be advantageous in reducing the width of the non-display area NDA.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
a substrate comprising a display area in which emission areas are arranged, and a non-display area disposed around the display area;
a circuit layer disposed on the substrate; and
an element layer disposed on the circuit layer, and comprising light emitting elements disposed in the emission areas, respectively,
wherein the circuit layer comprises:
light emitting pixel drivers electrically connected to the light emitting elements, respectively, and arranged in parallel with each other in a first direction and a second direction crossing the first direction;
gate lines arranged in the second direction in the display area, extending in the first direction, and for transmitting gate signals to the light emitting pixel drivers;
a gate driving circuit comprising a plurality of stages disposed in a portion of the non-display area, arranged in the first direction and electrically connected to the gate lines;
data lines extending in the second direction, and for transmitting data signals to the light emitting pixel drivers;
a display driving circuit configured to supply data signals of the data lines;
first auxiliary lines extending in the first direction; and
second auxiliary lines extending in the second direction and adjacent to the data lines in the first direction,
wherein the second auxiliary lines comprise gate bypass auxiliary lines electrically connected between the gate lines and the plurality of stages,
an edge of the display area comprises a first side extending in the first direction,
the gate driving circuit comprises a first center circuit portion facing a central portion of the first side in the second direction and comprising first stages of the plurality of stages arranged in the first direction,
the display area further comprises a display middle region facing the first center circuit portion in the second direction, a bypass region in contact with the display middle region in the first direction, and a side region disposed between the bypass region and the non-display area in the first direction, the display driving circuit and the first center circuit portion are arranged in the first direction in a portion of the non-display area facing the first side of the display area, the first center circuit portion face only the display middle region in the second direction among the display middle region, the bypass region, and the side region of the display area, and the display driving circuit face only the bypass region and/or the side region in the second direction among the display middle region, the bypass region, and the side region of the display area.

2. The display device of claim 1, wherein the edge of the display area further comprises:

a second side extending in the first direction and opposing to the first side in the second direction; and a third side and a fourth side connecting the first side to the second side, opposing each other in the first direction, and each having a shorter length than each of the first side and the second side, wherein the gate driving circuit comprises a first center circuit portion facing a central portion of the first side in the second direction and comprising first stages of the plurality of stages arranged in the first direction, the first auxiliary lines comprise a first bypass auxiliary line electrically connected to a first data line disposed in the display middle region among the data lines, the second auxiliary lines further comprise a second bypass auxiliary line adjacent to a second data line disposed in the bypass region among the data lines and electrically connected to the first bypass auxiliary line, and the gate bypass auxiliary lines are disposed in the display middle region.

3. The display device of claim 2, wherein the circuit layer further comprises data supply lines disposed in a portion of the non-display area facing the first side, spaced apart from the first center circuit portion in the first direction, and electrically connected between the data lines and the display driving circuit, among the data supply lines, a first data supply line, which transmits the data signal of the first data line, is electrically connected to the first data line through the first bypass auxiliary line and the second bypass auxiliary line, among the data supply lines, a second data supply line, which transmits the data signal of the second data line, is directly electrically connected to the second data line, and the first data line is adjacent to one of the gate bypass auxiliary lines in the first direction.

4. The display device of claim 3, wherein the display driving circuit is mounted on a portion of the non-display area of the substrate facing the first side, and is spaced apart from the first center circuit portion in the first direction.

5. The display device of claim 3, further comprising:

a circuit board on which the display driving circuit is mounted; and signal pads to which the circuit board is connected, wherein the signal pads are disposed in the non-display area of the substrate, face the first side, and are spaced apart from the first center circuit portion in the first direction.

6. The display device of claim 3, wherein the data supply lines extend to the bypass region and the side region, the data lines further comprise a third data line disposed in the side region, and among the data supply lines, a third data supply line, which transmits the data signal of the third data line, is directly electrically connected to the third data line.

7. The display device of claim 3, wherein each of the light emitting pixel drivers of the circuit layer further comprises:

a first transistor electrically connected between a first node and a second node;

a pixel capacitor electrically connected between a third node and a first power line for transmitting a first power;

a second transistor electrically connected between the data line and the first node;

a third transistor electrically connected between the second node and the third node;

a fourth transistor electrically connected between the third node and a gate initialization voltage line for transmitting a gate initialization voltage;

a fifth transistor electrically connected between the first power line and the first node;

a sixth transistor electrically connected between the second node and the fourth node; and a seventh transistor electrically connected between the fourth node and an anode initialization voltage line for transmitting an anode initialization voltage, wherein the first node is electrically connected to a first electrode of the first transistor, the second node is electrically connected to a second electrode of the first transistor, the third node is electrically connected to a gate electrode of the first transistor, the fourth node is electrically connected to one of the light emitting elements, and wherein the gate lines comprise:

a scan write line for transmitting a scan write signal to the light emitting pixel drivers;

a scan initialization line for transmitting a scan initialization signal to the light emitting pixel drivers;

an emission control line for transmitting an emission control signal to the light emitting pixel drivers; and a gate control line for transmitting a gate control signal to the light emitting pixel drivers, wherein the second transistor and the third transistor are turned on by the scan write signal, the fourth transistor is turned on by the scan initialization signal, the fifth transistor and the sixth transistor are turned on by the emission control signal, and the seventh transistor is turned on by the gate control signal.

8. The display device of claim 7, wherein the first center circuit portion comprises:

a scan write stage electrically connected to the scan write line;

a scan initialization stage electrically connected to the scan initialization line;

an emission control stage electrically connected to the emission control line; and a gate control stage electrically connected to the gate control line.

9. The display device of claim 7, wherein the gate driving circuit further comprises a second center circuit portion facing a central portion of the second side of the display area, wherein the display middle region of the display area is disposed between the first center circuit portion and the second center circuit portion in the second direction, wherein second stages of the second center circuit portion among the plurality of stages are arranged in the first direction, and are electrically connected to the gate lines through the gate bypass auxiliary lines, and wherein each of the first center circuit portion and the second center circuit portion comprises:

a scan write stage electrically connected to the scan write line;

a scan initialization stage electrically connected to the scan initialization line;

an emission control stage electrically connected to the emission control line; and a gate control stage electrically connected to the gate control line.

10. The display device of claim 7, wherein the gate driving circuit further comprises a side circuit portion facing at least one of the third side or the fourth side of the display area.

11. The display device of claim 10, wherein each of the first center circuit portion and the side circuit portion comprises:

a scan write stage electrically connected to the scan write line;

a scan initialization stage electrically connected to the scan initialization line;

an emission control stage electrically connected to the emission control line; and a gate control stage electrically connected to the gate control line.

12. The display device of claim 10, wherein some of the scan write line, the scan initialization line, the emission control line, and the gate control line are electrically connected to the first center circuit portion, and all of the scan write line, the scan initialization line, the emission control line, and the gate control line except for the some are electrically connected to the side circuit portion.

13. The display device of claim 7, wherein the gate lines further comprise a bias control line for transmitting a bias control signal to the light emitting pixel drivers, each of the light emitting pixel drivers of the circuit layer further comprises an eighth transistor electrically connected between a bias power line and the first node, and the eighth transistor is turned on by the bias control signal.

14. The display device of claim 7, wherein the first auxiliary lines further comprise power auxiliary horizontal lines, and the second auxiliary lines further comprise power auxiliary vertical lines.

15. A display device comprising:

a substrate comprising a display area in which emission areas are arranged and a non-display area disposed around the display area;

a circuit layer disposed on the substrate; and an element layer disposed on the circuit layer, and comprising light emitting elements disposed in the emission areas, respectively, wherein the circuit layer comprises:

light emitting pixel drivers electrically connected to the light emitting elements, respectively, and arranged in parallel with each other in a first direction and a second direction crossing the first direction;

gate lines arranged in the second direction in the display area, extending in the first direction, and for transmitting gate signals to the light emitting pixel drivers;

a gate driving circuit comprising a plurality of stages disposed in a portion of the non-display area, arranged in the first direction, and electrically connected to the gate lines;

data lines extending in the second direction, and for transmitting data signals to the light emitting pixel drivers;

first auxiliary lines extending in the first direction; and second auxiliary lines extending in the second direction and adjacent to the data lines in the first direction, wherein the display area further comprises a display middle region facing a first center circuit portion in the second direction, and a bypass region in contact with the display middle region in the first direction, the first auxiliary lines comprise a first bypass auxiliary line electrically connected to a first data line disposed in the display middle region among the data lines, and the second auxiliary lines comprise a second bypass auxiliary line adjacent to a second data line disposed in the bypass region among the data lines and electrically connected to the first bypass auxiliary line, and gate bypass auxiliary lines electrically connected between the gate lines and the plurality of stages.

16. The display device of claim 15, further comprising a display driving circuit configured to supply data signals of the data lines, wherein the circuit layer further comprises data supply lines disposed in a portion of the non-display area facing a first side of the display area, spaced apart from the first center circuit portion in the first direction, and electrically connected between the data lines and the display driving circuit, among the data supply lines, a first data supply line, which transmits the data signal of the first data line, is electrically connected to the first data line through the first bypass auxiliary line and the second bypass auxiliary line, among the data supply lines, a second data supply line, which transmits the data signal of the second data line, is directly electrically connected to the second data line, and the first data line is adjacent to one of the gate bypass auxiliary lines in the first direction.

17. The display device of claim 16, wherein an edge of the display area comprises the first side and a second side extending in the first direction and opposing each other in the second direction, and a third side and a fourth side connecting the first side to the second side, opposing each other in the first direction, and each having a shorter length than each of the first side and the second side, the gate driving circuit comprises a first center circuit portion facing a central portion of the first side in the second direction, and a second center circuit portion facing a central portion of the second side of the display area in the second direction, the display middle region of the display area is disposed between the first center circuit portion and the second center circuit portion in the second direction, and the plurality of stages of each of the first center circuit portion and the second center circuit portion are arranged in the first direction, and are electrically connected to the gate lines through the gate bypass auxiliary lines.

18. The display device of claim 16, wherein each of the light emitting pixel drivers of the circuit layer further comprises:
- a first transistor electrically connected between a first node and a second node;
- a pixel capacitor electrically connected between a third node and a first power line for transmitting a first power;
- a second transistor electrically connected between the data line and the first node;
- a third transistor electrically connected between the second node and the third node;
- a fourth transistor electrically connected between the third node and a gate initialization voltage line for transmitting a gate initialization voltage;
- a fifth transistor electrically connected between the first power line and the first node;
- a sixth transistor electrically connected between the second node and a fourth node; and
- a seventh transistor electrically connected between the fourth node and an anode initialization voltage line for transmitting an anode initialization voltage,
- wherein the first node is electrically connected to a first electrode of the first transistor,
- the second node is electrically connected to a second electrode of the first transistor,
- the third node is electrically connected to a gate electrode of the first transistor,
- the fourth node is electrically connected to one of the light emitting elements, and
- wherein the gate lines comprise:
- a scan write line for transmitting a scan write signal to the light emitting pixel drivers;
- a scan initialization line for transmitting a scan initialization signal to the light emitting pixel drivers;
- an emission control line for transmitting an emission control signal to the light emitting pixel drivers; and
- a gate control line for transmitting a gate control signal to the light emitting pixel drivers,
- wherein the second transistor and the third transistor are turned on by the scan write signal,
- the fourth transistor is turned on by the scan initialization signal,
- the fifth transistor and the sixth transistor are turned on by the emission control signal, and
- the seventh transistor is turned on by the gate control signal.

19. The display device of claim 18, wherein an edge of the display area comprises the first side and a second side extending in the first direction and opposing each other in the second direction, and a third side and a fourth side connecting the first side to the second side, opposing each other in the first direction, and each having a shorter length than each of the first side and the second side,
- the gate driving circuit comprises a first center circuit portion facing a central portion of the first side in the second direction and comprising first stages of the plurality of stages arranged in the first direction, and a side circuit portion facing at least one of the third side or the fourth side of the display area in the first direction,
- the first stages of the first center circuit portion are arranged in the first direction, and are electrically connected to the gate lines through the gate bypass auxiliary lines, and
- each of the first center circuit portion and the second center circuit portion is electrically connected to the scan write line, the scan initialization line, the emission control line, and the gate control line.

20. The display device of claim 18, wherein an edge of the display area comprises the first side and a second side extending in the first direction and opposing each other in the second direction, and a third side and a fourth side connecting the first side to the second side, opposing each other in the first direction, and each having a shorter length than each of the first side and the second side,
- the gate driving circuit comprises a first center circuit portion facing a central portion of the first side in the second direction and comprising first stages of the plurality of stages arranged in the first direction, and a side circuit portion facing at least one of the third side or the fourth side of the display area in the first direction,
- the first stages of the first center circuit portion are arranged in the first direction, and are electrically connected to the gate lines through the gate bypass auxiliary lines,
- second stages of the side circuit portion among the plurality of stages are arranged in the second direction,
- some of the scan write line, the scan initialization line, the emission control line, and the gate control line are electrically connected to the first center circuit portion, and
- all of the scan write line, the scan initialization line, the emission control line, and the gate control line except for the some are electrically connected to the side circuit portion.

* * * * *